US00RE46110E

(19) United States
(12) Reissued Patent
Kajigaya

(10) Patent Number: US RE46,110 E
(45) Date of Reissued Patent: Aug. 16, 2016

(54) SEMICONDUCTOR DEVICE HAVING SINGLE-ENDED SENSING AMPLIFIER

(71) Applicant: PS4 LUXCO S.A.R.L., Luxembourg (LU)

(72) Inventor: Kazuhiko Kajigaya, Tokyo (JP)

(73) Assignee: PS4 LUXCO S.A.R.L., Luxembourg (LU)

(21) Appl. No.: 13/957,312

(22) Filed: Aug. 1, 2013

Related U.S. Patent Documents

Reissue of:
(64) Patent No.: 7,990,793
Issued: Aug. 2, 2011
Appl. No.: 12/382,493
Filed: Mar. 17, 2009

(30) Foreign Application Priority Data

Mar. 17, 2008 (JP) ..... 2008-068161
Mar. 16, 2009 (JP) ..... 2009-062363

(51) Int. Cl.
*G11C 7/00* (2006.01)
*G11C 5/14* (2006.01)
*G11C 11/4091* (2006.01)
*G11C 7/06* (2006.01)

(52) U.S. Cl.
CPC ..... *G11C 5/147* (2013.01); *G11C 7/067* (2013.01); *G11C 11/4091* (2013.01)

(58) Field of Classification Search
USPC ..... 365/211, 207, 189.11
See application file for complete search history.

(56) References Cited

U.S. PATENT DOCUMENTS 5,493,533 A * 2/1996 Lambrache ..... 365/175
5,677,886 A * 10/1997 Seo ..... G11C 7/065 365/203
6,157,222 A 12/2000 Yaklin
6,477,090 B2 11/2002 Yamaki et al.
6,643,193 B2 11/2003 Yamaki et al.
6,992,912 B2 1/2006 Kang
7,057,958 B2 * 6/2006 So et al. ..... 365/211
7,102,935 B2 * 9/2006 Miki et al. ..... 365/189.09
7,227,769 B2 * 6/2007 Fukushi ..... G11C 11/22 365/145

(Continued)

FOREIGN PATENT DOCUMENTS

EP 0090572 B1 11/2006
JP 58-168310 10/1983

(Continued)

OTHER PUBLICATIONS

Korean Office Action dated Sep. 29, 2010, with partial Japanese and English translation.

*Primary Examiner* — Angela M Lie
(74) *Attorney, Agent, or Firm* — Kunzler Law Group, PC

(57) ABSTRACT

A semiconductor device has a DRAM cell configured from an information charge accumulating capacitor and a memory cell selecting transistor, the threshold voltage value of a MOS transistor that constitutes a sense circuit is monitored, and the monitored threshold voltage value of the MOS transistor is converted through the use of a transfer ratio that is determined based on the capacitance of the information charge accumulating capacitor and the parasitic capacitance of the bit line. The converted voltage value is level-shifted so that the pre-charge voltage of a pre-charge circuit is a pre-set voltage, a current feeding capability is added to the level-shifted voltage value, and the voltage is fed as the pre-charge voltage.

36 Claims, 17 Drawing Sheets

(56) References Cited

U.S. PATENT DOCUMENTS

| | | | | |
|---|---|---|---|---|
| 7,359,265 | B2 * | 4/2008 | Yuan | G11C 7/08 365/201 |
| 7,472,296 | B2 * | 12/2008 | Kato | G06K 7/0008 713/300 |
| 7,697,358 | B2 | 4/2010 | Kajigaya | |
| 7,701,794 | B2 | 4/2010 | Kajigaya | |
| 7,742,330 | B2 * | 6/2010 | Takemura | G11C 13/0004 365/148 |
| 7,986,579 | B2 * | 7/2011 | Akaogi | G11C 7/04 365/185.18 |
| 2004/0179414 | A1 | 9/2004 | Hsu | |

FOREIGN PATENT DOCUMENTS

| | | |
|---|---|---|
| JP | H5-242681 (A) | 9/1993 |
| JP | H11-297084 (A) | 10/1999 |
| JP | 2000-307391 | 11/2000 |
| JP | 2002-74997 (A) | 3/2002 |
| JP | 2005-11486 (A) | 1/2005 |
| JP | 2008-262632 (A) | 10/2008 |
| JP | 2008-282456 (A) | 11/2008 |
| JP | 2008-294310 (A) | 12/2008 |
| KR | 2004-0080357 A | 9/2004 |
| KR | 2004-0080357 (A) | 9/2004 |

* cited by examiner

SEMICONDUCTOR DEVICE HAVING SINGLE-ENDED SENSING AMPLIFIER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application claims priority, makes reference to, incorporates the same herein, and claims all benefits accruing under 35 U.S.C. §119 from an application for SEMICONDUCTOR DEVICE HAVING SINGLE-ENDED SENSING AMPLIFIER, earlier filed in the Japanese Patent Office on 17 Mar. 2008 and there duly assigned Japanese Patent Application No. 2008-068161, the entire disclosure of which is hereby incorporated by reference in its entirety, and an application for SEMICONDUCTOR DEVICE HAVING SINGLE-ENDED SENSING AMPLIFIER, earlier filed in the Japanese Patent Office on 16 Mar. 2009 and there duly assigned Japanese Patent Application No. 2009-062363, the disclosure of which is hereby incorporated by reference in its entirety.

This application cross references application for commonly-assigned U.S. patent application Ser. No. 12/382,495, entitled Device having Single-Ended Sensing Amplifier filed on Mar. 17, 2009, the entire contents of which is incorporated herein in its entirety, and commonly assigned U.S. patent application Ser. No. 12/382 494, now U.S. Pat. No. 7,869,294 (B2), entitled Device having Single-Ended Sensing Amplifier filed on Mar. 17, 2009, the entire contents of which is incorporated herein in its entirely.

BACKGROUND OF THE INVENTION

1. Field of the Disclosure

The present disclosure relates to a sense circuit used in a semiconductor device, and particularly relates to a sense circuit for suitably compensating for temperature dependence of the threshold voltage in a MOS (metal-oxide-semiconductor) transistor that constitutes a sense circuit, to a temperature compensation method for a sense circuit, and to a data processing system.

2. Description of Related Art

It is known that the threshold voltage in a MOS transistor used in a semiconductor device generally varies depending on temperature, and that the temperature margin of the circuit is thereby reduced. Numerous techniques have therefore been proposed to compensate for this temperature dependence.

The technique disclosed in Japanese Patent Application Laid-Open No. S58-168310, for example, relates to a sense amplifier circuit in MOS static memory, and the on output level of the output buffer of the sense amplifier circuit is stabilized using a differential amplifier by varying the output level of the differential amplifier according to temperature.

The technique disclosed in Japanese Patent Application Laid-Open No. 2000-307391 relates to control of the input threshold value of a voltage comparator. The disclosed voltage comparator includes a PMOS (p-channel metal-oxide-semiconductor) transistor in which a signal is inputted to the gate, the drain is connected to a power supply, and the source is connected to an output line, and two NMOS (n-channel metal-oxide-semiconductor) transistors connected in series between the output line and the ground, wherein the NMOS transistors are arranged in a column, a signal is inputted to the gate of one NMOS transistor connected in series, and a fixed control voltage is inputted to the gate of the other NMOS transistor. This technique emphasizes the fact that the conductance of a MOS transistor is uniquely related to the gate voltage, and supposing that the circuit described above is an equivalent circuit configured from a resistor, attempts to control the input threshold of the voltage comparator by adjusting the individual gate voltages fed to each MOS transistor and varying the conductance.

FIG. 19 is a diagram showing the threshold voltage distribution, i.e., the allowable range of manufacturing variation, of a MOS transistor in a case in which temperature compensation is not applied in a sense circuit used in DRAM (dynamic random access memory) having a hierarchical bit line structure. The vertical axis indicates voltage, and the bar graph on the left side indicates the memory cell node potential when the power supply potential VDD is 1 V (volt). The bit line pre-charge potential is set to 0 V.

It is usually the case in DRAM that high data of 1 V and low data of 0 V are written in a memory cell node, but loss occurs due to leakage, inadequate writing, or the like. In this example, the high data is 0.7 V and the low data is 0.2 V due to loss. When a word line is high, and a memory cell is selected, a signal voltage is read to the bit line by the transfer of charge between the bit line parasitic capacitor Cb and the capacitor Cs of the memory cell. This read signal voltage occurs in the bit line as the voltage of the memory cell node minus the portion accounted for by the transfer ratio Cs/(Cs+Cb). The transfer ratio is 0.7 in this example.

The signal voltage read to the bit line undergoes further loss due to noise during reading, and in this example, the high read signal voltage is 0.45 V, and the low read signal voltage is about 0.18 V. This difference in voltage is amplified by a MOS transistor and converted to a drain current difference, and in order for a global bit line sense circuit to properly determine high or low for the difference of the global bit line discharge time, there must be a determination margin between the lower limit of the high read voltage and the upper limit of the MOS transistor threshold voltage distribution, and between the upper limit of the low read voltage and the lower limit of the MOS transistor threshold voltage distribution.

As previously mentioned, since the threshold voltage of a MOS transistor generally varies depending on the temperature, the distribution of the threshold voltage due to manufacturing variation must be kept small so as to be able to accommodate variation due to temperature dependence in order to ensure the abovementioned determination margin at the operating compensation temperature, which in this example is between 0° C. and 100° C. (Celsius).

SUMMARY

However, the technique disclosed in Japanese Patent Application Laid-Open No. S58-168310 has drawbacks in that the circuit scale is large, and the chip size increases due to the fact that a differential amplifier is provided for each sense amplifier. Furthermore, since the technique of Japanese Patent Application Laid-Open. No. S58-168310 involves adjusting the gain of the differential amplifiers, the technique cannot be applied without modification to a so-called single-ended sense amplifier or the like that is configured from a single MOS transistor, for example.

Since a large number of MOS transistors are required in the technique disclosed in Japanese Patent Application Laid- Open No. 2000-307391, the circuit scale is large, and the chip size increases. Furthermore, since temperature compensation is performed in a state in which a voltage is applied to the gates of numerous MOS transistors, this technique suffers from increased power consumption.

The disclosure was therefore developed in view of the drawbacks described above, and an object of the disclosure is to provide a sense circuit, a temperature compensation method for a sense circuit, and a data processing system whereby the chip size is prevented from increasing, and temperature dependence of a MOS transistor is compensated for while the power consumption is kept from increasing.

The disclosure for overcoming the abovementioned drawbacks includes the aspects described below.

(1) The disclosure provides a semiconductor device including a sense amplifier including a sensing transistor for amplifying data signal and a control transistor connected to a signal line, the sensing transistor including a gate electrode connected to the signal line for transmitting the data signal and a drain connected to an output line, and the control transistor controlling a potential of the signal line to a predetermined potential before the data signal is transmitted to the signal line; an internal power supply circuit connected to a source of the control transistor or a source of the sensing transistor; and a temperature compensation circuit for compensating for temperature dependence of the sensing transistor by controlling an output voltage of the internal power supply circuit.

(2) The disclosure also provides a semiconductor device including a memory cell including a storage element for storing information and a selecting transistor for selecting the storage element; a bit line connected to the memory cell; a sense amplifier including a sensing transistor for reading data on the bit line and a control transistor connected to the bit line, the sensing transistor including a gate connected to the bit line and a drain connected to an output line, and the control transistor controlling a potential of the bit line to a predetermined potential before the information is read out from the memory cell to the bit line; an internal power supply circuit connected to a source of the control transistor or a source of the sensing transistor; and a temperature compensation circuit configured from field-effect transistors for compensating for temperature dependence of the sensing transistor by controlling an output voltage of the internal power supply circuit.

(3) The disclosure also provides a semiconductor device including a memory cell including a capacitor for storing an electric charge, and a selecting transistor for selecting the capacitor; a bit line connected to the memory cell; a sense amplifier including a sensing transistor that works as a single-ended sensing amplifier configured from a field-effect transistor for reading data on the bit line and a control transistor connected to the bit line, the sensing transistor having a gate connected to the bit line and a drain connected to an output line, and the control transistor controlling a potential of the bit line to a predetermined potential before the information is read out from the memory cell to the bit line; an internal power supply circuit connected to a power supply of the sense amplifier; and a temperature compensation circuit configured from field-effect transistors for compensating for temperature dependence of the sensing transistor by controlling an output voltage of the internal power supply circuit, wherein the predetermined voltage of the bit line or the source voltage of the sensing transistor is controlled by the output voltage.

A change that accompanies temperature dependence of the threshold voltage of a field-effect transistor is cancelled out, and the operating margin of a sense circuit is therefore enhanced, and the memory sense operation is also stabilized. In other words, from an opposite perspective, since the allowable range of variation in the manufacturing of field-effect transistors can be enlarged, the manufacturing yield is enhanced for memory that uses numerous sense circuits, such as high-capacity DRAM to which the disclosure is applied, and the cost of manufacturing can also be reduced.

Since the temperature dependence of the field-effect transistor is monitored, and the change due to the temperature dependence is cancelled out, temperature can be compensated for with a high degree of precision, and the effects described above can be even further enhanced. Since the allowable range of variation in the manufacturing of field-effect transistors can also be enlarged, memory can also be provided that is adapted for miniaturization and an increased degree of integration.

Since a temperature compensation circuit is mounted for each semiconductor chip (each semiconductor substrate), secondary effects are obtained whereby variations between chips, wafers, and lots with regard to the threshold voltages of the field-effect transistors that constitute sense circuits are also cancelled out by having the same amount of level shift for each semiconductor chip. It is thereby possible to provide a semiconductor system that includes a controller for controlling semiconductor devices so as to have uniform characteristics for all the semiconductor device in a module (e.g., an MCP (Multi-Chip Package), POP (Package-On-Package), or other semiconductor device in which a plurality of semiconductor chips is layered, or a semiconductor device in which a plurality of semiconductor devices is integrated without being layered (e.g., a planar package)) or the like in which a plurality of semiconductor chips is mounted, even when each of the semiconductor chips is manufactured under different conditions, and the capability or characteristics of the sensing transistors vary, or when the semiconductor chips are placed in locations having different temperature conditions.

BRIEF DESCRIPTION OF THE DRAWINGS

The above features and advantages of the disclosure will be more apparent from the following description of certain preferred embodiments taken in conjunction with the accompanying drawings, in which.

DETAILED DESCRIPTION OF THE EMBODIMENTS

Example embodiments of the disclosure will be described in detail hereinafter with reference to the accompanying drawings.

The constituent elements in the embodiments described herein can be substituted with existing constituent elements and the like, and various variations including combinations with other existing constituent elements are also possible. The scope of the present disclosure as described in the claims is thus not limited by the embodiments described herein.

Embodiment 1

Example embodiment 1 of the disclosure will be described using FIGS. 1 through 9. In the first embodiment, an example will be described of DRAM (Dynamic Random Access Memory) having a hierarchical bit line structure as a semiconductor device that uses an N-type channel field-effect transistor (nMOS transistor) and a P-type channel field-effect transistor (pMOS transistor). Since the length of the bit line can be reduced in the case of a hierarchical bit line structure, the amplitude of signals read from the memory cell can be increased, and the overall chip size can be reduced. Although this is a preferred example, the disclosure is not limited to this example.

For example, the disclosure can be applied to not only a DRAM but also to other kind of volatile memory device, a non-volatile memory device and so on. It is sufficient insofar as the transistor is a field-effect transistor (FET), and besides a MOS (Metal Oxide Semiconductor), the disclosure can also be applied to a MIS (Metal-Insulator Semiconductor) transistor and various other FETs. An NMOS transistor (N-type-channel MOS transistor) is a typical example of a first-conductivity-type transistor, and PMOS transistor (P-type-channel MOS transistor) is a typical example of a second-conductivity-type transistor.

The configuration of the present embodiment is a technique relating to a single-ended sense amplifier in which a single signal is inputted, only one signal is amplified, and the amplified signal is outputted. A common differential sense amplifier has a higher gain than a single-ended sense amplifier and is also more resistant to noise. The high gain of a differential sense amplifier also reduces the time taken to vary the amplified output signal. On the other hand, a single-ended sense amplifier is extremely sensitive to noise, and requires a higher input signal in order to generate an amplified output. The aforementioned sense amplifier (temperature compensation sense circuit 2) connected to the bit line is a single-ended sense amplifier.

<Overall Circuit Structure>

Figure 1:
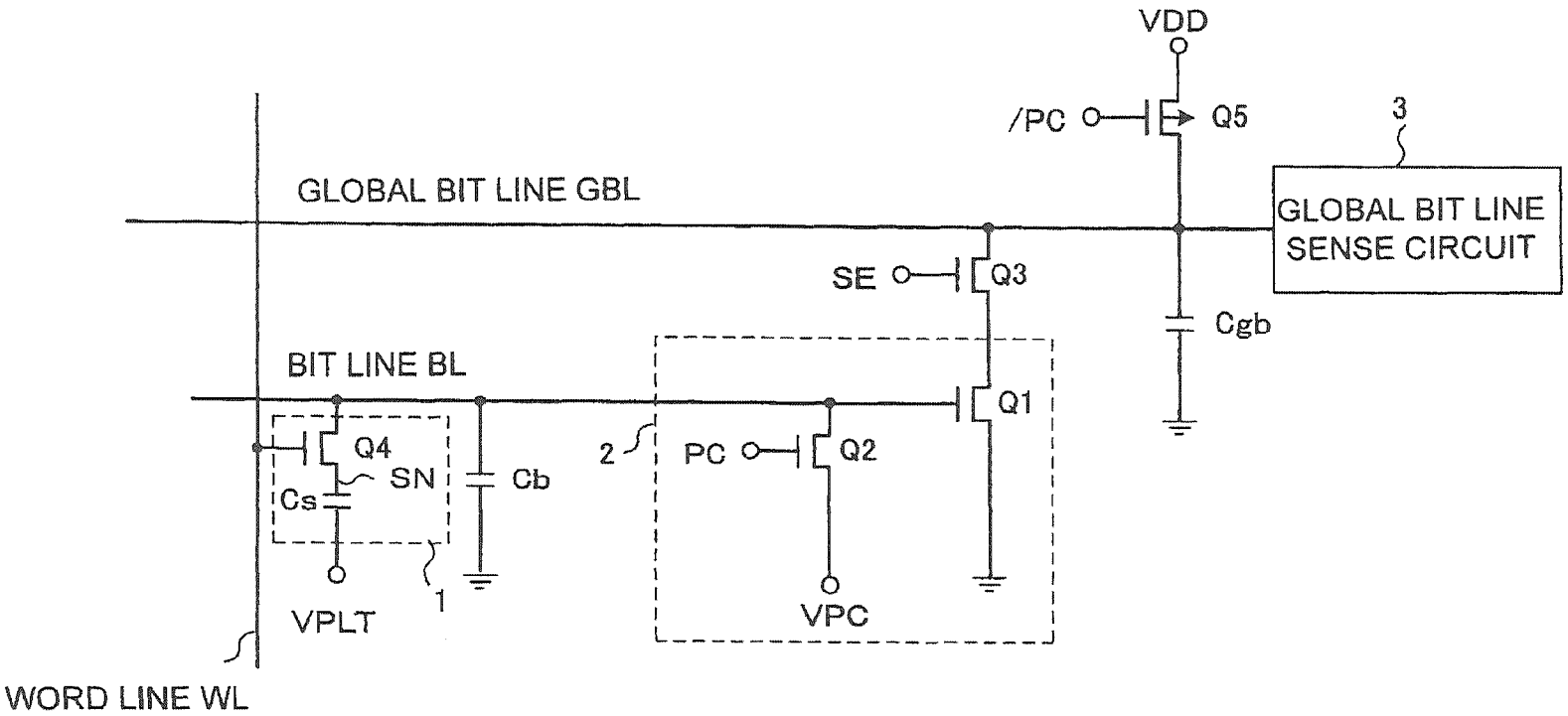
FIG. 1 is a schematic diagram showing the temperature compensation sense circuit according to an example Embodiment 1.

FIG. 1 is a diagram showing a portion of the circuits of a DRAM memory cell array that includes the temperature compensation sense circuit. As shown in FIG. 1, the circuit is configured from a word line WL, a bit line BL (local bit line), a memory cell 1 provided at the junction of the word line WL and the bit line BL, a temperature compensation sense circuit 2, a global bit line GBL, and a global bit line sense circuit 3.

The temperature compensation sense circuit 2 is a single-ended sense amplifier. A gate electrode of the sense amplifier transistor is connected to the bit line BL that is used to transmit information stored in the memory cell 1; and a drain electrode of the sense amplifier transistor that functions as an output node thereof is connected to the global bit line GBL. That is, the temperature compensation sense circuit 2 uses a direct sensing technique of a single-ended sense amplifier.

Furthermore, the voltage (pre-charge voltage) for controlling the bit line prior to accessing of the memory cell is controlled by a common internal voltage (e.g., an internal power supply voltage that is stepped down from an external power supply) for driving the memory cell, a VSS (negative or ground potential) power supply, or another voltage, rather than through the use of the bit line ½ pre-charge scheme (in which the bit line control voltage prior to accessing of the memory cell is controlled to a ½ voltage that is in between relative voltages that correspond to information 1 and information 0) that has come to be used in DRAM and the like. For example, a characteristic feature of the embodiments is that the bit line voltage after the memory cell is accessed is transitioned in one direction (of the VSS or the internal power supply voltage) from the internal power supply voltage or the predetermined potential of the VSS, regardless of whether the memory cell information is "1" or "0." In a semiconductor device in which the voltages of the external power supply and internal power supply of the semiconductor device are lowered to near 1 V (a voltage that is near the limit of the operating point at which a CMOS-type sense amplifier operates), the control voltage of the bit line combines with a sensing scheme that utilizes the single-ended sense amplifier to produce enhanced synergistic effects of higher speed and stability, and circuit stability due to variations in manufacturing conditions.

A hierarchical bit line structure includes a single-ended sense amplifier 2 for first amplifying the information of the memory cell 1, which is the data signal, via a local bit line, and a selection transistor Q3 connected between the sense amplifier 2 and the global bit line GBL.

The selection transistor Q3 for selecting a sense circuit is a transistor for outputting an amplified signal amplified by the single-ended sense amplifier 2 to the global bit line GBL. A control signal supplied to the selection transistor Q3 is a control signal for outputting the amplified signal amplified by the single-ended sense amplifier 2 to the global bit line GBL. The control signal may include an address signal or other selection information for selecting a plurality of local bit lines and a single global bit line. In general, since numerous memory cells and sense amplifier 2 are connected to a local bit line BL to form a memory array, the wiring pitch of the local bit line BL is equal to or smaller than the wiring pitch of the global bit line GBL.

An nMOS transistor Q1 constituting the temperature compensation sense circuit 2 is a sensing transistor, the bit line BL is connected to the gate thereof, and the nMOS (n-type-channel metal oxide semiconductor) transistor Q1 senses/amplifies a signal voltage read to the bit line BL and converts the signal voltage to a drain current. In the present embodiment, a pre-charge voltage as the output voltage of an internal power supply circuit is controlled, the temperature dependence of the nMOS transistor Q1 that constitutes the sense circuit is compensated for, and the temperature of a MOS transistor is compensated for accurately while the power consumption is prevented from increasing. However, the details of the temperature compensation will be described hereinafter.

A bit line pre-charge nMOS transistor Q2 is a control transistor for controlling the signal line to a predetermined potential before a data signal is transmitted by the signal line. A pre-charge signal PC is inputted to the gate of the bit line pre-charge nMOS transistor Q2, and when the pre-charge signal PC is in a high state, the bit line BL is pre-charged to a bit line pre-charge potential VPC.

An nMOS transistor Q3 for sense circuit selection receives a selection signal SE at the gate thereof, and selectively connects the global bit line GBL to the drain of the nMOS transistor Q1 that is the output node of the sense circuit. The bit line BL and a plurality of memory cells are connected to the global bit line GBL via a plurality of temperature compensation sense circuits not shown in the diagram of FIG. 1, and the nMOS transistor Q3 connects only the sense amplifier to which the selected memory cell belongs to the global bit line GBL. Re-writing is required, since data are destroyed once read from a DRAM memory cell, but a re-writing circuit is not shown in FIG. 1 in order to simplify the diagram.

A memory cell array is formed by a plurality of memory cells and a plurality of sense amplifiers that correspond to the memory cells, a hierarchical bit line is formed by the local bit line and the global bit line, and the output of the internal power supply circuit controlled by the temperature compensation circuit is connected in common to the sense amplifiers that are connected to the local bit lines.

It is sufficient insofar as the nMOS transistor Q3 and the nMOS transistor Q1 are connected in series, and the sequential relation thereof is essentially unlimited. Ideally, since a large number of nMOS transistors Q3 are connected to the global bit line GBL, the nMOS transistor Q3 should be connected on the side of the global bit line GBL as shown in FIG. 1 when the low noise effects of the global bit line GBL are emphasized.

The memory cell is a DRAM memory cell in which an nMOS transistor Q4 for selection and a capacitor Cs for information charge accumulation that is a storage element for storing information is. connected in series. The nMOS transistor Q4 for selection selects the capacitor Cs for information charge accumulation by the voltage of the word line, and connects the capacitor Cs to the bit line. A plurality of memory cells not shown in the drawing is connected to the bit line. The parasitic capacitance of the bit line is indicated by Cb, and although not particularly prescribed, Cs in this example is 10 fF, and Cb is 30/7 (≈4.3) fF (femto Farad).

A global bit line pre-charge MOS transistor Q5 is a pMOS transistor for receiving the inverse signal/PC of the pre-charge signal PC at the gate thereof, and /PC pre-charges the global bit line GBL to the power supply potential VDD when /PC is in a low state. The parasitic capacitance of the global bit line is indicated as Cgb.

In the present embodiment, the polarities of the MOS transistors are as described above, but it is also possible to form a circuit in which the polarities of the MOS transistors are all reversed. In this case, the relationship of the power supply potential and the ground is reversed, and the polarity of the control signal is also reversed.

<Operation of the Temperature Compensation Circuit>

The operation of the temperature compensation circuit according to a temperature change will next be described using FIGS. 2 through 4.

In order to make the description more specific in the present embodiment, the threshold value Vt of the nMOS transistor Q1 is assumed to be 90 mV±30 mV (millivolts), but this value is given only as an example, and the present disclosure is not limited by this value.

Figure 2:
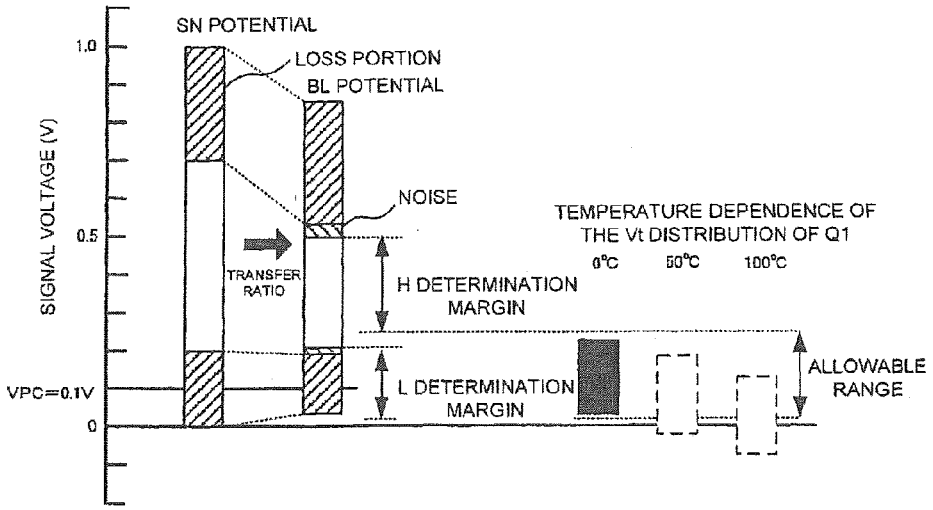
FIG. 2 is a diagram showing the operation when T=0° C. in the temperature compensation sense circuit according to Embodiment 1.
Figure 19:
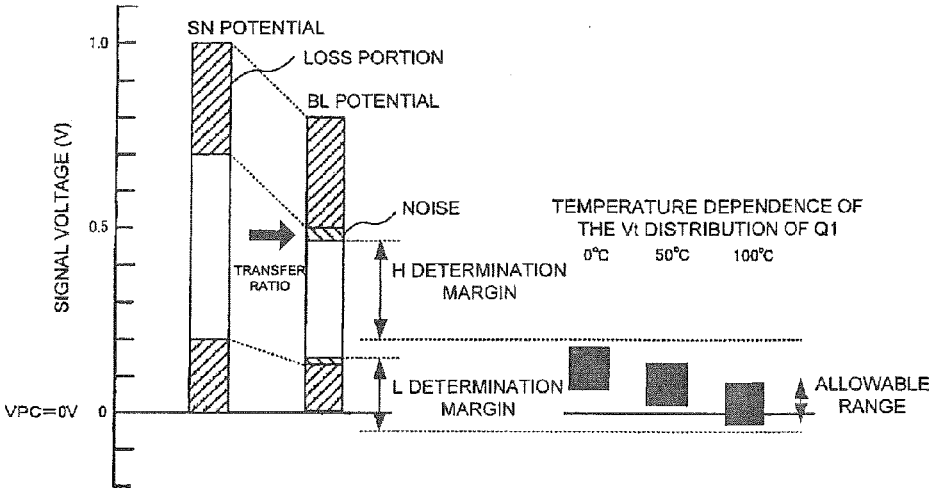
FIG. 19 is a diagram showing the Vt allowance margin when there is no temperature compensation.

FIG. 2 shows a case in which the temperature T is 0° C. When the temperature T=50° C. is the reference temperature, the threshold voltage Vt of the nMOS transistor Q1 increases 30 mV in this example. At this time, the bit line pre-charge potential VPC is set to 0.1 V by the VPC generation circuit described hereinafter. Since the signal voltage read to the bit line is increased by (1−Transfer Ratio)*VPC=(1−0.7)×0.1=0.03 V, i.e., 30 mV, by the bit line pre-charge potential VPC shifting 0.1 V, the increase of 30 mV due to temperature dependence of the threshold voltage Vt of the nMOS transistor Q1 can be cancelled out. Consequently, the allowable range of the distribution due to manufacturing variation of the threshold voltage Vt of the nMOS transistor Q1 can be increased in comparison to the case of FIG. 19 in which there is no temperature compensation.

Figure 3:
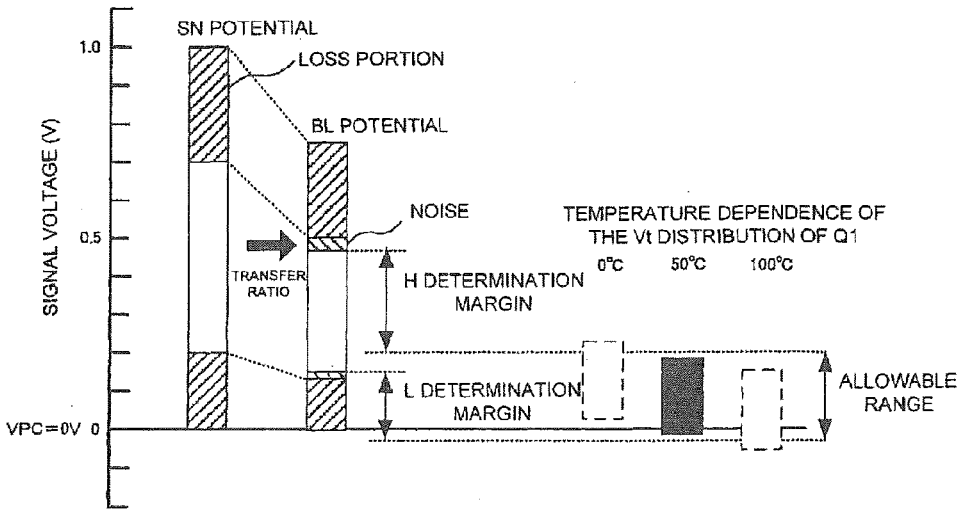
FIG. 3 is a diagram showing the operation when T=50° C. in the temperature compensation sense circuit according to Embodiment 1.

FIG. 3 shows a case in which the temperature T is 50° C. In this instance, since temperature T=50° C. is the reference temperature, the threshold voltage Vt of the nMOS transistor Q1 is also the reference value in this example. The bit line pre-charge potential VPC at this time is set to 0 V by the VPC generation circuit described hereinafter. Since the bit line pre-charge potential VPC is 0 V, the signal voltage read to the bit line is the same as in FIG. 19, but because the temperature dependence of the threshold voltage Vt of the nMOS transistor Q1 at another temperature is cancelled out, the allowable range of the distribution due to manufacturing variation of the threshold voltage Vt of the nMOS transistor Q1 can be increased in comparison to the case of FIG. 19.

Figure 4:
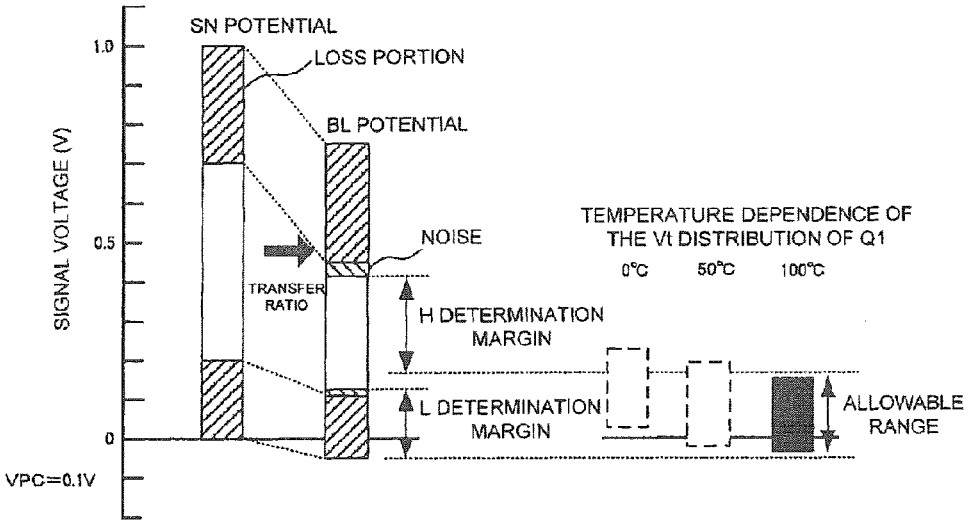
FIG. 4 is a diagram showing the operation when T=100° C. in the temperature compensation sense circuit according to Embodiment 1.

FIG. 4 shows a case in which the temperature T is 100° C. When the temperature T=50° C. is the reference temperature, the threshold voltage Vt of the nMOS transistor Q1 decreases 30 mV in this example. At this time, the bit line pre-charge potential VPC is set to −0.1 V by the VPC generation circuit described hereinafter. Since the signal voltage read to the bit line is decreased by (1−Transfer Ratio)*VPC−(1−0.7)×(−0.1)=−0.03 V, i.e., 30 mV, by the bit line pre-charge potential VPC shifting −0.1 V, the decrease of 30 mV due to temperature dependence of the threshold voltage Vt of the nMOS transistor Q1 can be cancelled out. Consequently, the allowable range of the distribution due to manufacturing variation of the threshold voltage Vt of the nMOS transistor Q1 can be increased in comparison to the case of FIG. 19.

<Structure of the Temperature Compensation Circuit (VPC Generation Circuit)>

The structure of the temperature compensation circuit (VPC generation circuit) will be described using FIG. 5.

Figure 5:
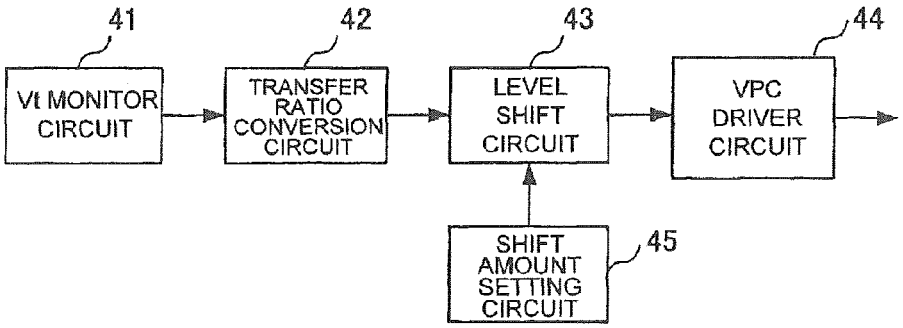
FIG. 5 is a block diagram showing the VPC generation circuit according to Embodiment 1.

As shown in FIG. 5, the temperature compensation circuit (VPC generation circuit) is configured from a Vt monitor circuit 41, a transfer ratio conversion circuit 42, a level shift circuit 43, a VPC driver circuit 44, and a shift amount setting circuit 45.

First, the output voltage of the Vt monitor circuit 41 for monitoring the temperature dependence of the threshold voltage Vt of the nMOS transistor Q1 is converted by the transfer ratio conversion circuit 42 and inputted to the level shift circuit 43. Information for determining the shift amount is transmitted from the shift amount setting circuit 45 to the level shift circuit 43, and the shift amount is determined based on this information.

The shift amount setting circuit 45 is set so that the bit line pre-charge potential VPC is 0 V at the reference temperature described above, which is 50° C. in this example. This operation is performed by setting the wafer temperature to 50° C. and programming the setting value of the shift amount setting circuit 45 for each chip while monitoring the value of the bit line pre-charge potential VPC at the time of a DRAM probe inspection, for example. Alternatively, a shift amount as a reference may be determined, and the same value may be programmed for each chip. In this case, secondary effects are obtained whereby it is also possible to cancel out Vt variations between chips, wafers, and lots.

Laser fusing, electric fusing, a non-volatile memory element, a one-time programmable element, or the like can be used as the programming means. The output of the level shift circuit 43 is fed to the source potential of the bit line pre-charge nMOS transistor Q2 through the VPC driver circuit 44 for increasing the current drive capability.

<Structure of the Vt Monitor Circuit>

Figure 6:
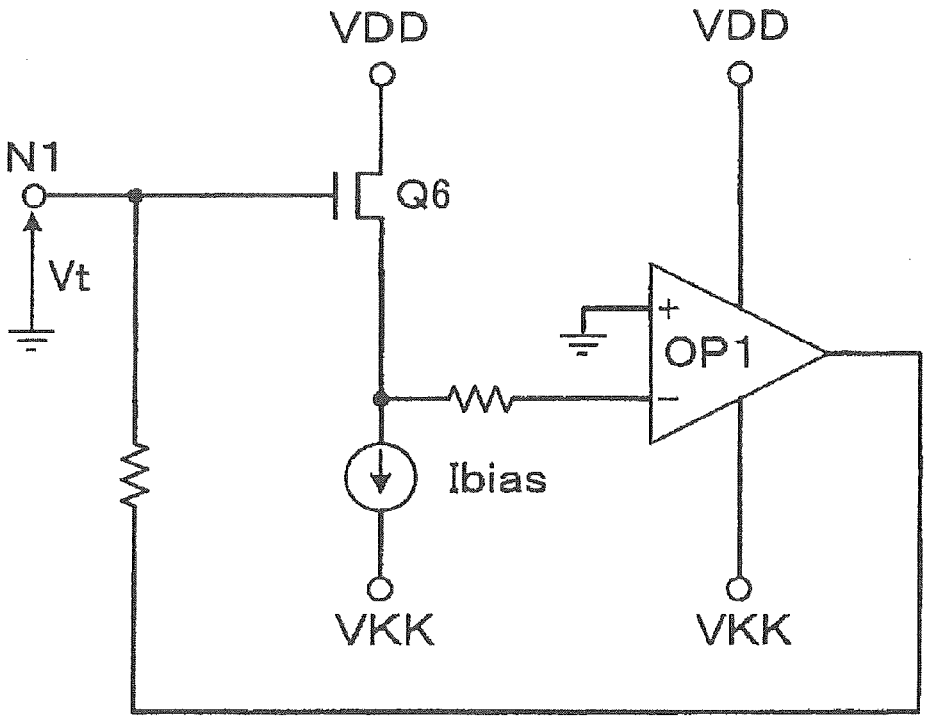
FIG. 6 is a schematic diagram showing the Vt monitor circuit according to Embodiment 1.

FIG. 6 shows an example of the Vt monitor circuit for monitoring the threshold voltage Vt of the nMOS transistor Q1.

In this arrangement, VKK is a negative power supply potential. The nMOS transistor Q6 is a monitor transistor that monitors the threshold voltage of the nMOS transistor Q1, and is therefore formed having substantially the same size as the nMOS transistor Q1. A current source for supplying a constant current Ibias for defining the threshold voltage is connected between the VKK and the source of the nMOS transistor Q6. Since an operational amplifier OP1 controls the gate potential of the nMOS transistor Q6 so that the source potential of the nMOS transistor Q6 is the ground potential 0 V in the state in which the constant current is flowing, the threshold voltage Vt of the nMOS transistor Q6 based on the ground voltage is outputted to the output node N1. Consequently, the threshold voltage Vt of the nMOS transistor Q1 can be accurately monitored by a simple circuit structure.

<Structure of the Transfer Ratio Conversion Circuit, the Level Shift Circuit, And the VPC Driver Circuit>

Figure 7A:
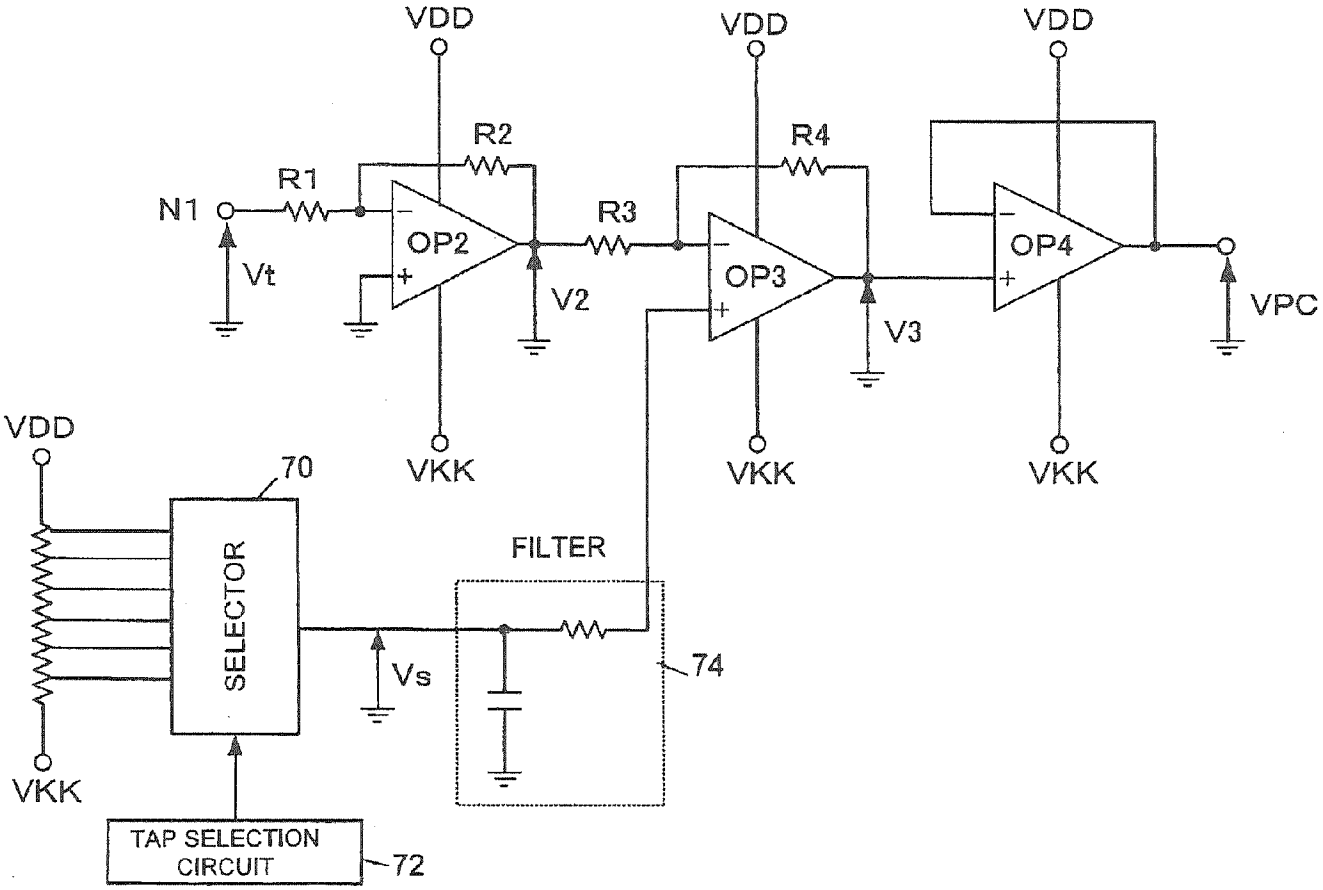
FIG. 7A is a schematic diagram showing the VPC generation circuit without the Vt monitor circuit according to Embodiment 1.

FIG. 7A shows the structure of the transfer ratio conversion circuit, the level shift circuit, and the VPC driver circuit. The transfer ratio conversion circuit 42 is an inverting amplifier circuit that uses an operational amplifier OP2, and N1, i.e., the threshold voltage Vt of Q6 in FIG. 6, is applied to the input thereof. The ratio of the resistors R1 and R2 is set equal to the ratio of Cb and Cs+Cb, and the output voltage V2 of OP2 is −(Cs+Cb)Vt/Cb. Consequently, the optimum compensation value can be set after taking into account the effect of the parasitic capacitance Cb and the capacitance of the information charge accumulating capacitor Cs.

The level shift circuit 43 is an inverting amplifier circuit that uses an operational amplifier OP3, wherein the output voltage −(Cs+Cb)Vt/Cb of OP2 is applied to the input, and the output potential Vs of the shift amount setting circuit 45 as a shift voltage is applied to a terminal that is usually the ground. Since the resistance of the level shift circuit 43 is R3=R4, and the gain is set to −1, the output voltage V3 of OP3 is ((C2+Cb)*Vt)/Cb+2Vs.

The shift amount setting circuit 45 divides the resistance of the power supply potential VDD and the negative power supply potential VKK, selects the desired potential by a selector from among the numerous intermediate potentials thus extracted, and outputs the potential as Vs. The intermediate potential to be selected by the selector 70 is programmed in a tap selection circuit 72, and the selector 70 selects the desired potential in accordance with the output signal of the tap selection circuit 72. The output potential Vs of the shift amount setting circuit 45 is fed through a low-pass filter 74 to the level shift circuit 43.

The VPC driver circuit is a voltage follower circuit that uses an operational amplifier OP4, and the output voltage of the OP3 is outputted as bit line pre-charge potential VPC= ((Cs+Cb)*Vt)/Cb+2Vs.

<Sense Circuit Processing>

The sense circuit of the present embodiment performs processing such as described hereinafter and compensates for the temperature of the MOS transistor that constitutes the sense circuit.

Figure 7B:
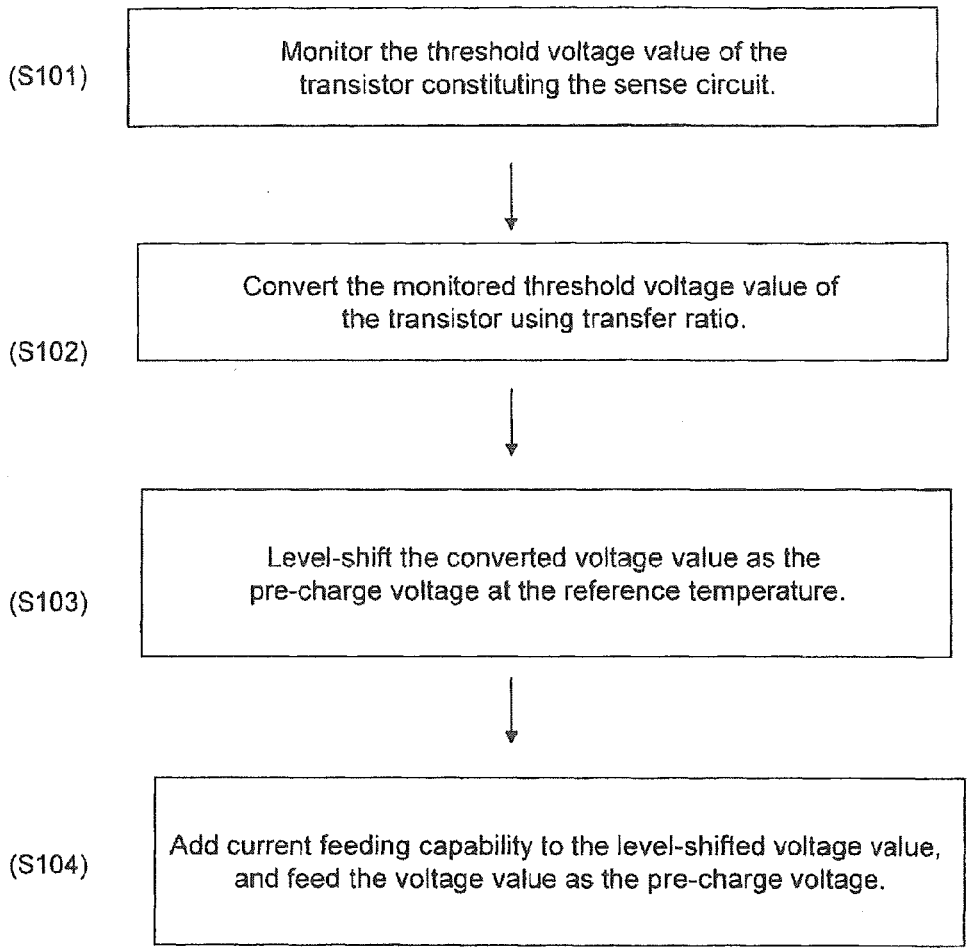
FIG. 7B is a diagram of the sense circuit processing according to example Embodiment 1.

Referring to FIG. 7B, first, the threshold voltage value of the MOS transistor constituting the sense circuit is monitored (step S101), and the monitored threshold voltage value of the MOS transistor is converted through the use of a transfer ratio that is determined from the capacitance of the information charge accumulating capacitor and the parasitic capacitance of the bit line (step S102).

The converted voltage value is then level-shifted so as to be a voltage set in advance as the pre-charge voltage at the reference temperature (step S103), current feeding capability is added to the level-shifted voltage value, and the voltage value is fed as the pre-charge voltage (step S104).

Consequently, through the use of a simple structure, the temperature of a MOS transistor constituting the sense circuit can be accurately compensated for, and the operating margin of the sense circuit can be adequately maintained.

<VPC Generation Process>

Figure 8:
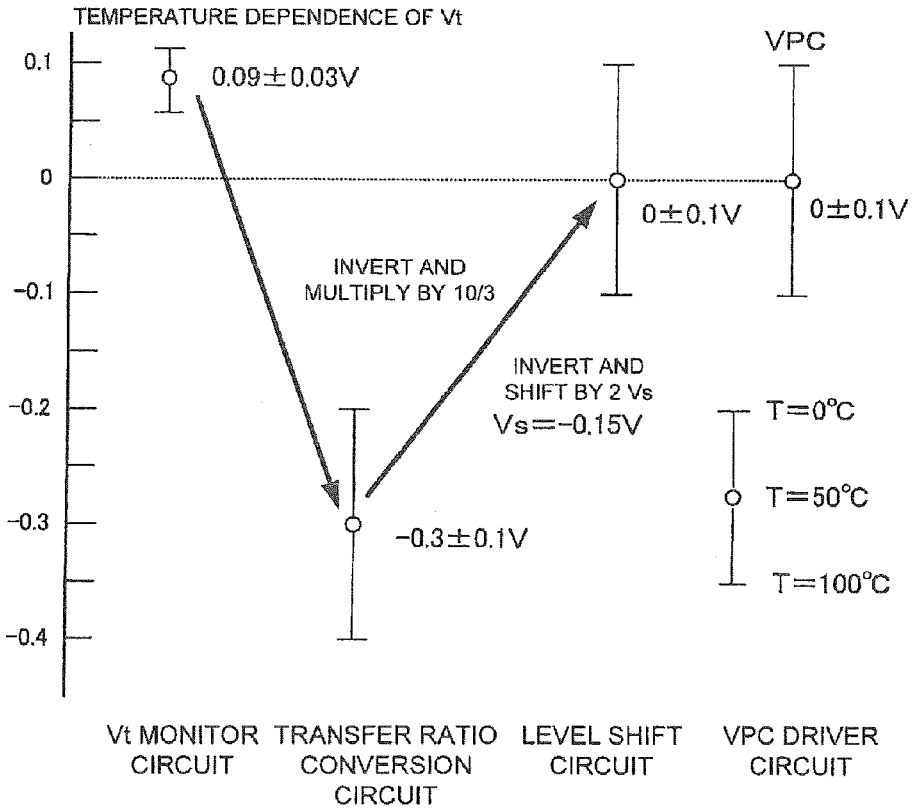
FIG. 8 is a diagram showing the VPC generation process according to Embodiment 1.

The VPC generation process will next be specifically described using FIG. 8.

FIG. 8 is a schematic diagram showing the output voltage transitions of each circuit in the VPC generation circuit described above. In the present embodiment, Cs=10 fF, and Cb=30/7 (≈4.3) fF, as previously described. In the Vt monitor circuit 41, the threshold voltage Vt of Q6 (which is the monitor transistor of Q1) at the reference temperature 50° C. is 0.09 V, and the temperature dependence of the threshold voltage Vt of Q6, for which the change due to temperature dependence between 0° C. and 100° C. is ±0.03 V, is monitored and outputted. This voltage is inverted by the transfer ratio conversion circuit 42 and multiplied by 10/3 to give −0.3±0.1 V.

The voltage is then inverted again by the level shift circuit 43 and shifted by 2Vs. In the present embodiment, since the output voltage of the level shift circuit 43 is set to 0 V at the reference temperature 50° C., the tap selection circuit of the shift amount setting circuit 45 is programmed so that the value of Vs is −0.15 V, and the output potential of the level shift circuit 43 becomes 0±0.1 V. This voltage is outputted from the VPC driver circuit 44 as the bit line pre-charge potential VPC. In this arrangement, when the shift amount Vs is programmed to be the same value for each chip, the Vt variation of each chip or the variation between wafers and lots is reflected in the VPC.

<Operational Waveform of the Sense Circuit>

The operational waveform of the sense circuit when temperature compensation is performed will next be described using FIG. 9. In FIG. 9, the vertical axis indicates voltage, and the horizontal axis indicates time.

A case will be described in which high ("H") data are read from the memory cell (FIG. 9(A)). Each bit line pre-charge potential VPC is set to the ground potential 0 V.

In the case of high data reading, PC is low and /PC is high in the pre-charge release period, the nMOS transistor Q2 and the pMOS transistor Q5 each turn off, and the bit line BL and the global bit line GBL are floating in a state of being pre-charged to 0V and VDD, respectively.

Then, when the cell selection period occurs, a high signal voltage is read to the bit line from the memory cell when SE (sense amplifier selection signal) and WL (word line) have changed to high (specifically, the memory cell is accessed, whereby the charge of the memory cell data is transmitted to the bit line BL (signal line) in accordance with the capacitance ratio with the bit line (signal line)), and the sense period begins. In the sense period, since the potential of the bit line is higher than the upper limit of the distribution of the threshold voltage Vt of the nMOS transistor Q1, the drain current of the nMOS transistor Q1 is large, and the charge charged by the parasitic capacitance Cgb of the global bit line GBL withdraws rapidly. The potential of the global bit line GBL therefore rapidly discharges from VDD to 0 V.

The potential of the global bit line GBL at the end of the sense period is 0 V, and this potential is detected as low by the global bit line sense circuit, and inverted by an inverter circuit (not shown) and read as high data. The distribution of the threshold voltage Vt of the nMOS transistor Q1, which is the shaded portion of the diagram in FIGS. 9A and 9B, indicate the range of dimensional variation at the time of manufacturing, the variation of the gate insulation film thickness, or the variation of the threshold voltage due to such factors as fluctuation of the channel impurity distribution. When the restore period occurs, SE changes to low, the bit line potential is changed to the high level of VDD by a rewriting circuit (not shown), and high data are written back to the memory cell.

Figure 9B:
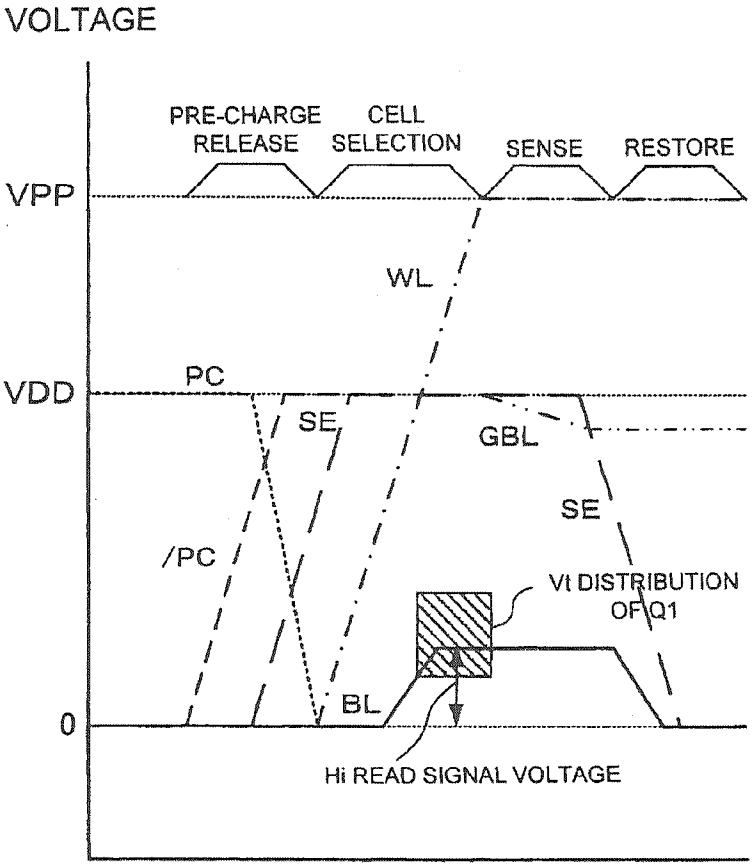
FIG. 9 is an operational waveform diagram for the temperature compensation sense circuit according to example Embodiment 1.
Figure 9A:
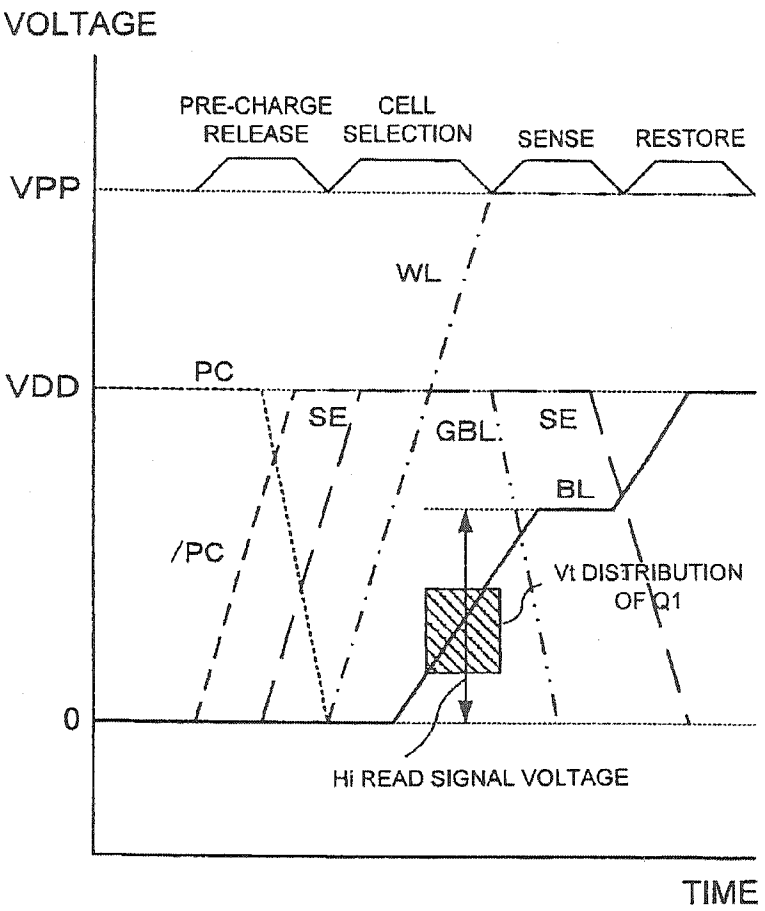

In a case in which low ("L") data are read from the memory cell (FIG. 9(B)), PC is low and /PC is high in the pre-charge release period, the nMOS transistor Q2 and the pMOS (p-type metal oxide semiconductor) transistor Q5 each turn off, and the bit line BL and the global bit line GBL are floating in a state of being pre-charged to 0V and VDD, respectively.

Then, when the cell selection period occurs, a low signal voltage is read to the bit line from the memory cell when the selection signal SE and word line WL have changed to high, and the sense period begins. In the sense period, since the potential of the bit line is slightly higher than the lower limit of the distribution of the threshold voltage Vt of the nMOS transistor Q1, the drain current of the nMOS transistor Q1 is small, the charge charged by the parasitic capacitance Cgb of the global bit line GBL withdraws slowly, and the potential of the global bit line GBL slowly discharges from VDD.

Since the potential of the global bit line GBL at the end of the sense period is slightly lower than VDD, the potential is sense-amplified as high by the global bit line sense circuit, and inverted by an inverter circuit (not shown) and read as low data. When the restore period occurs, SE changes to low, the bit line potential is changed to a low level of 0 V by a rewriting circuit (not shown), and low data are written back to the memory cell.

Through the present embodiment as described above, the pre-charge voltage is controlled, and the temperature dependence of the MOS transistor constituting the sense circuit is compensated for, and temperature compensation can therefore be accurately performed by a simple structure. Since variations that accompany temperature dependence of the threshold voltage of the MOS transistor constituting the sense circuit are cancelled out, the operating margin of the sense circuit is enhanced, and the sense operation of the memory is stabilized. Furthermore, since the allowable range of variation in the manufacturing of MOS transistors can be enlarged, memory can be provided that is adapted for miniaturization and an increased degree of integration.

The operating margin of the sense circuit is enhanced, and the sense operation of the memory is stabilized by temperature compensation as described above in the sense circuit according to the present embodiment. The sense circuit can therefore also be used in high-precision data processing systems and the like.

Embodiment 2

An example Embodiment 2 of the disclosure will be described using FIGS. 10 through 18. In the present embodiment, an example will be described of DRAM having a hierarchical bit line structure as a semiconductor device.

<Overall Circuit Structure>

Figure 10:
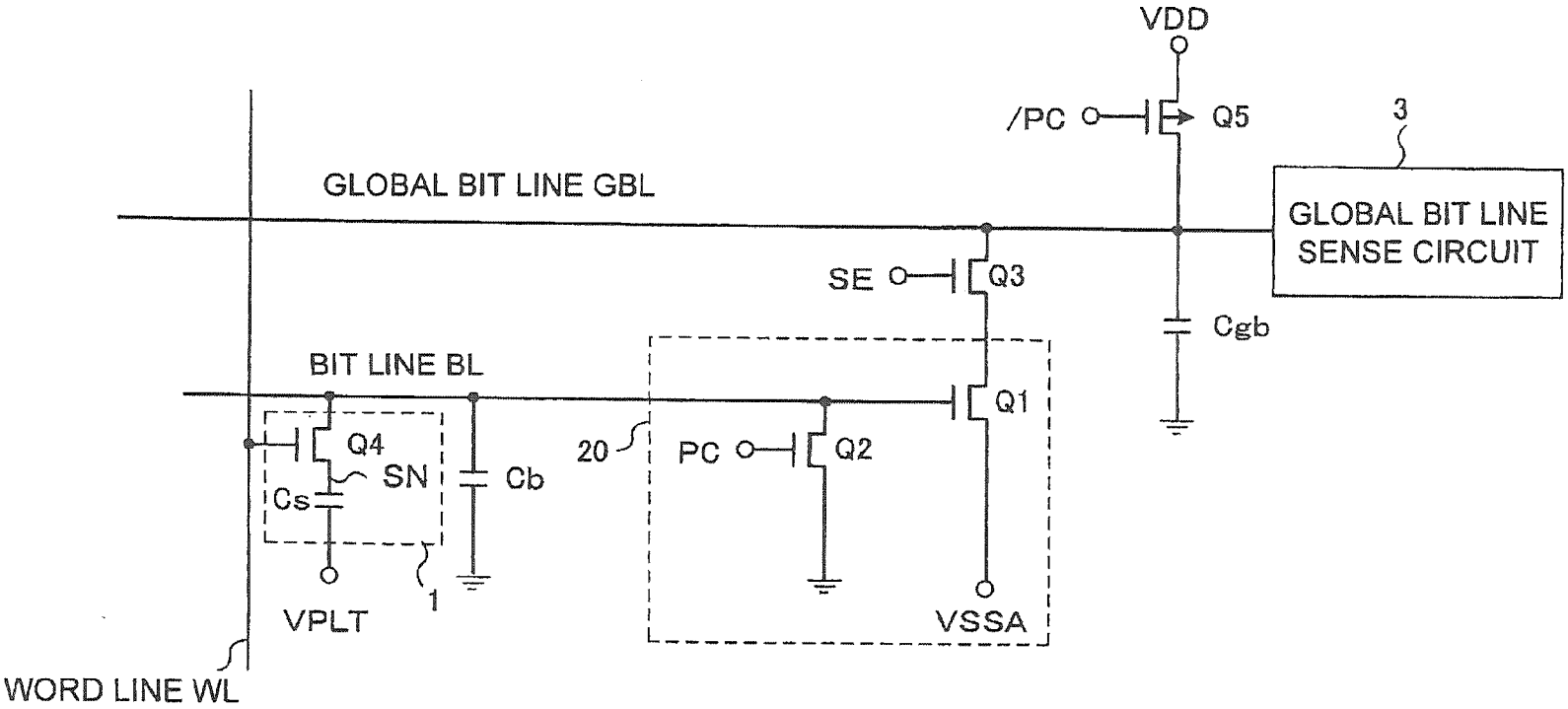
FIG. 10 is a schematic diagram showing the temperature compensation sense circuit according to example Embodiment 2.

FIG. 10 is a diagram showing a portion of the circuits of a DRAM memory cell array that includes the temperature compensation sense circuit of the disclosure. As shown in FIG. 10, the circuit is configured from a word line WL, a bit line BL, a memory cell 1 provided at the junction of the word line WL and the bit line BL, a temperature compensation sense circuit 20, a global bit line GBL, and a global bit line sense circuit 3. The same reference symbols are used to refer to constituent elements that are the same as those of Embodiment 1, and since the same elements have the same functions, no detailed description thereof will be given.

In the nMOS transistor Q1 constituting the temperature compensation sense circuit 20, the bit line BL is connected to the gate of the transistor Q1, and the nMOS transistor Q1 senses/amplifies a signal voltage read to the bit line BL and converts the signal voltage to a drain current. In the present embodiment, the source potential of the nMOS transistor Q1 is controlled to a potential set in advance, the temperature dependence is compensated for, and the temperature of a MOS transistor is compensated for accurately while the power consumption is prevented from increasing. However, the details of the temperature compensation will be described hereinafter.

<Operation of the Temperature Compensation Circuit>

The operation of the temperature compensation circuit according to a temperature change will next be described using FIGS. 11 through 13.

Figure 11:
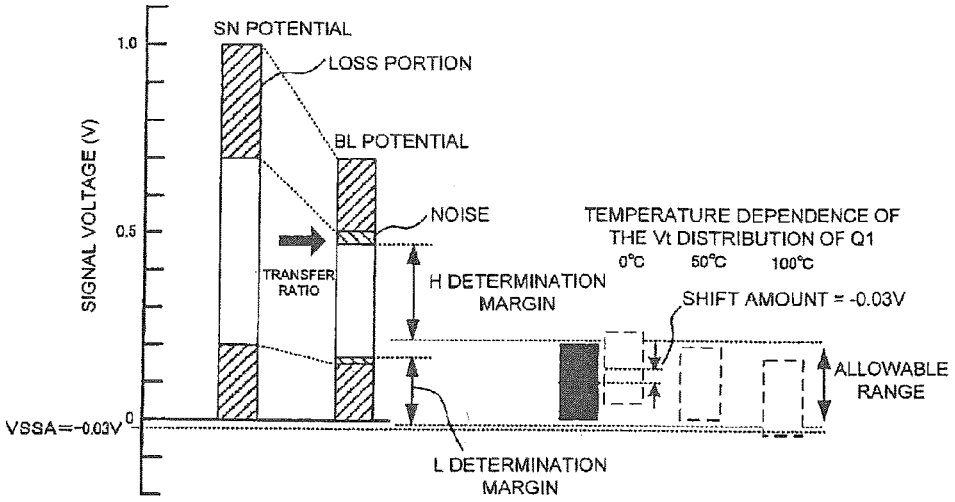
FIG. 11 is a diagram showing the operation when T=0° C. in the temperature compensation sense circuit according to Embodiment 2.

FIG. 11 shows a case in which the temperature T is 0° C. When the temperature T=50° C. is the reference temperature, the threshold voltage Vt of the nMOS transistor Q1 increases 30 mV in this example. At this time, the voltage VSSA is set to −0.03 V by a VSSA generation circuit described hereinafter. Since the threshold voltage Vt of the nMOS transistor Q1 as viewed from the bit line is decreased by −0.03 V, i.e., 30 mV, by the voltage VSSA shifting −0.03 V, the increase of 30 mV due to temperature dependence of the threshold voltage Vt of the nMOS transistor Q1 can be cancelled out. Consequently, the allowable range of the distribution due to manufacturing variation of the threshold voltage Vt of the nMOS transistor Q1 can be increased in comparison to the case of FIG. 19 in which there is no temperature compensation.

Figure 12:
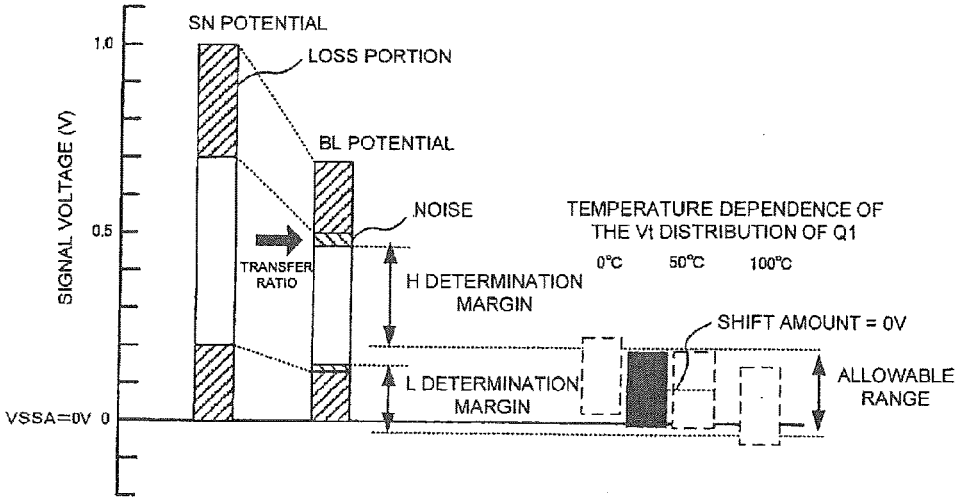
FIG. 12 is a diagram showing the operation when T=50° C. in the temperature compensation sense circuit according to Embodiment 2.

FIG. 12 shows a case in which the temperature T is 50° C. In this instance, since temperature T=50° C. is the reference temperature, the threshold voltage Vt of the nMOS transistor Q1 is also the reference value in this example. The voltage VSSA at this time is set to 0 V by the VSSA generation circuit described hereinafter. Since the voltage VSSA is 0 V, the signal voltage read to the bit line is the same as in FIG. 19, but because the temperature dependence of the threshold voltage Vt of the nMOS transistor Q1 at another temperature is cancelled out, the allowable range of the distribution due to manufacturing variation of the threshold voltage Vt of the nMOS transistor Q1 can be increased in comparison to the case. of FIG. 19.

Figure 13:
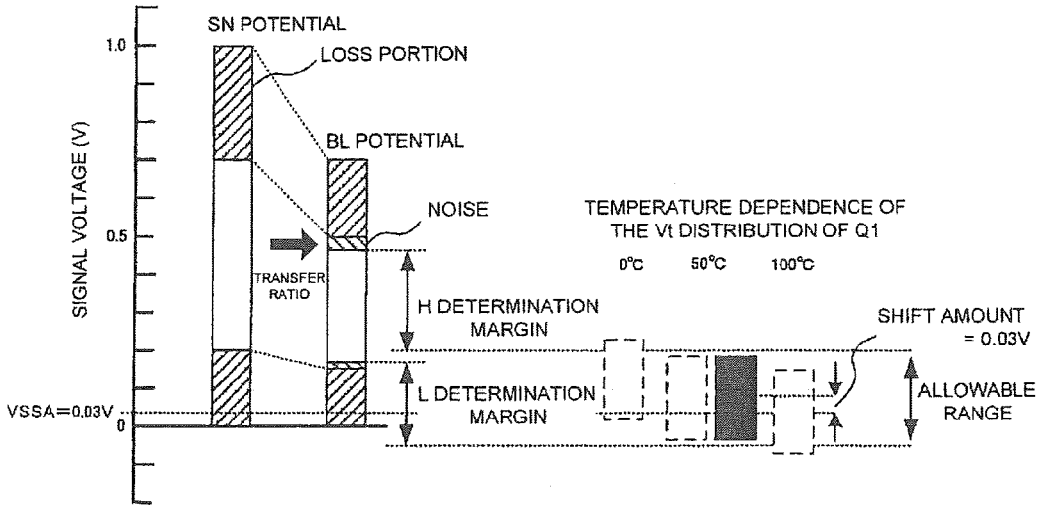
FIG. 13 is a diagram showing the operation when T=100° C. in the temperature compensation sense circuit according to Embodiment 2.

FIG. 13 shows a case in which the temperature T is 100° C. When the temperature T=50° C. is the reference temperature, the threshold voltage Vt of the nMOS transistor Q1 decreases 30 mV in this example. At this time, the voltage VSSA is set to 0.03 V by the VSSA generation circuit described hereinafter. Since the threshold voltage Vt of the nMOS transistor Q1 as viewed from the bit line is increased by 0.03 V, i.e., 30 mV, by the voltage VSSA shifting 0.03 V, the decrease of 30 mV due to temperature dependence of the threshold voltage Vt of the nMOS transistor Q1 can be cancelled out. Consequently, the allowable range of the distribution due to manufacturing variation of the threshold voltage Vt of the nMOS transistor Q1 can be increased in comparison to the case of FIG. 19 in which there is no temperature compensation.

<Structure of the Temperature Compensation Circuit (VSSA Generation Circuit)>

The structure of the temperature compensation circuit (VSSA generation circuit) will be described using FIG. 14.

Figure 14:
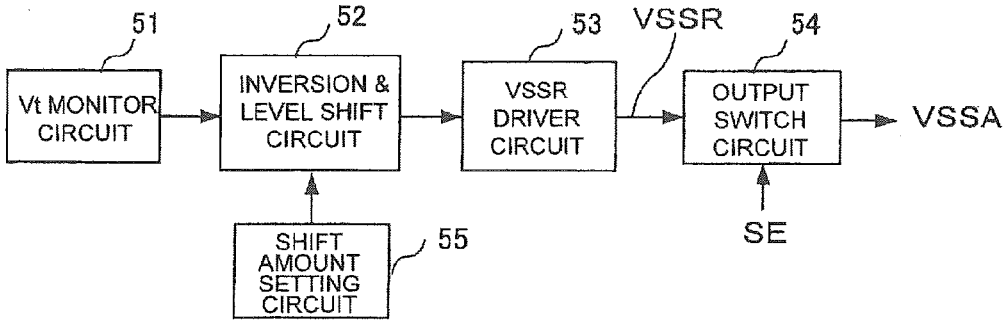
FIG. 14 is a block diagram showing the VSSA generation circuit according to Embodiment 2.

As shown in FIG. 14, the temperature compensation circuit (VSSA generation circuit) is configured from a Vt monitor circuit 51, an inversion & level shift circuit 52, a VSSR driver circuit 53, an output switch circuit 54, and a shift amount setting circuit 55.

First, the output voltage of the Vt monitor circuit 51 for monitoring the temperature dependence of the threshold voltage Vt of the nMOS transistor Q1 is inputted to the inversion & level shift circuit 52. Information for determining the shift amount is transmitted from the shift amount setting circuit 55 to the inversion & level shift circuit 52, and the shift amount is determined based on this information.

The shift amount setting circuit 55 is set so that the voltage VSSA is 0 V at the reference temperature described above, which is 50° C. in this example. This operation is performed by setting the wafer temperature to 50° C. and programming the setting value of the shift amount setting circuit 55 for each chip while monitoring the value of the voltage VSSA at the time of a DRAM probe inspection, for example.

A shift amount as a reference may also be determined, and the same shift amount may be programmed for each chip. Such a configuration is effective because it is also possible to cancel out variations even when the threshold voltage Vt of the nMOS transistor Q1 varies for each chip or between wafers or lots.

Laser fusing, electric fusing, a non-volatile memory element, a one-time programmable element, or the like can be used as the programming means. The output of the level shift circuit 52 is fed to the bit line pre-charge nMOS transistor Q2 through the VSSR driver circuit 53 for increasing the current drive capability.

The output switch circuit 54 switches the power supply of the VSSA from the temperature-compensated VSSR to the ground voltage (VSS) after a certain delay time after a read signal has occurred in the bit line, and a sense amplification operation has been initiated by the nMOS transistor Q1. The reason for this is that because the effects of variation of the threshold voltage Vt of the nMOS transistor Q1 decrease when the sense operation has progressed to a certain degree, the speed of the amplification operation can be increased by switching the voltage VSSA from the VSSR driver 53 to the ground potential (VSS), which has higher current driving capability.

<Structure of the Vt Monitor Circuit>

Figure 15:
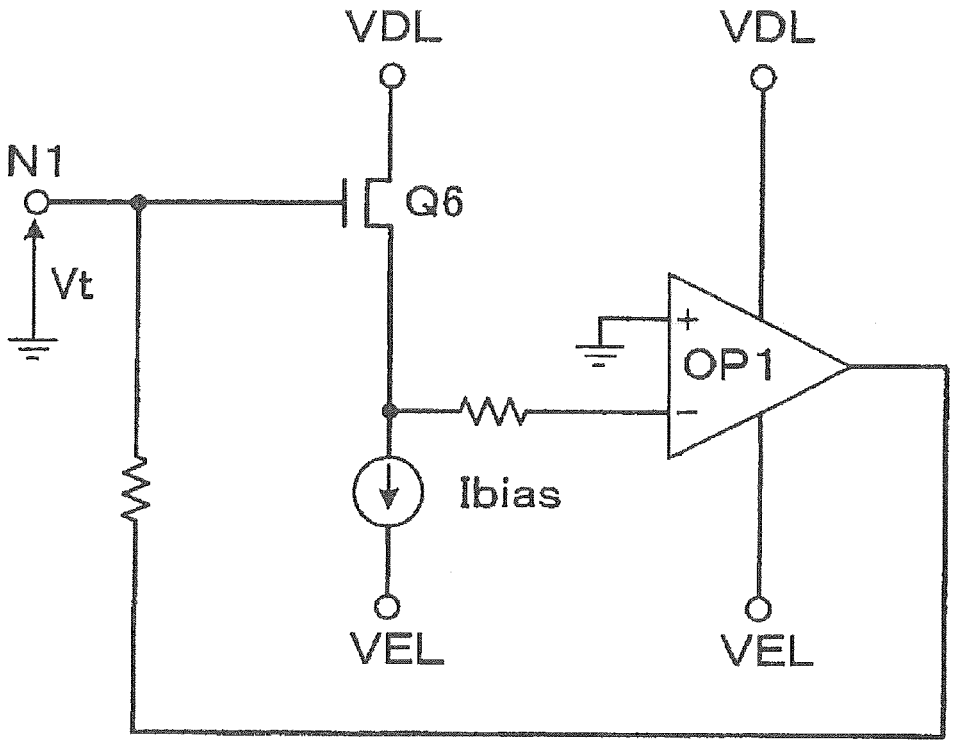
FIG. 15 is a schematic diagram showing the Vt monitor circuit according to Embodiment 2.

FIG. 15 shows an example of the Vt monitor circuit 51 for monitoring the threshold voltage Vt of the nMOS transistor Q1.

In this arrangement, VDL indicates a positive internal constant-voltage power supply potential, and VEL indicates a negative internal constant-potential power supply potential. The nMOS transistor Q6 monitors the threshold voltage of the nMOS transistor Q1, and is therefore formed having substantially the same size as the nMOS transistor Q1. A current source for supplying a constant current Ibias for defining the threshold voltage is connected between the VEL and the source of the nMOS transistor Q6. Since an operational amplifier OP1 controls the gate potential of the nMOS transistor Q6, so that the source potential of the nMOS transistor Q6 is the ground potential 0 V in the state in which the constant current is flowing, the threshold voltage Vt of the nMOS transistor Q6 based on the ground voltage is outputted to the output node N1. Consequently, the threshold voltage Vt of the nMOS transistor Q1 can be accurately monitored by a simple circuit structure.

<Structure of the Inversion & Level Shift Circuit, the VSSR Driver Circuit, And the Output Switch Circuit>

Figure 16A:
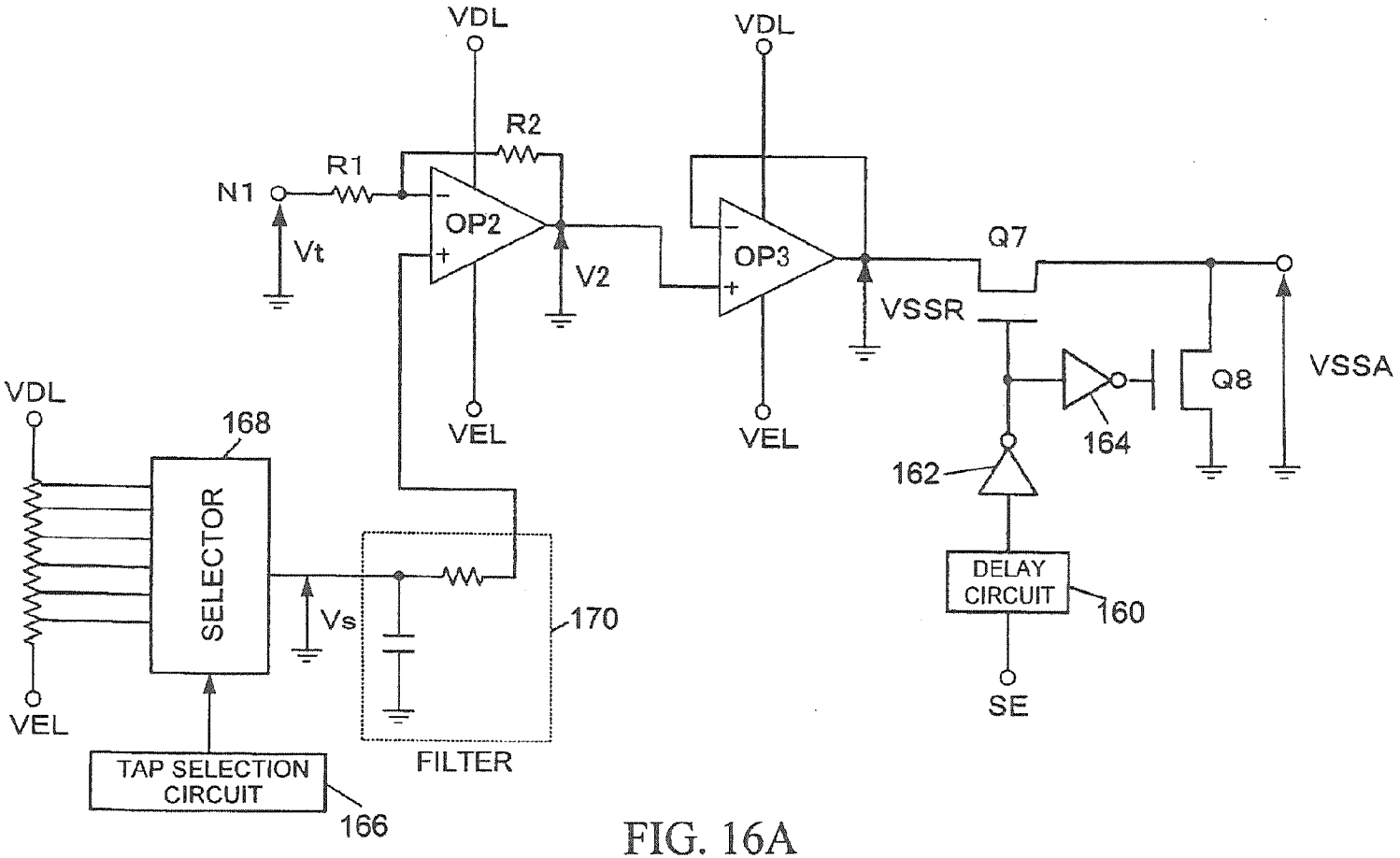
FIG. 16A is a schematic diagram showing the VSSA generation circuit without the Vt monitor circuit according to Embodiment 2.

FIG. 16A shows the structure of the inversion & level shift circuit, the VSSR driver circuit 53, and the output switch circuit 54. The inversion & level shift circuit 52 is an inverting amplifier circuit that uses an operational amplifier OP2, wherein N1, i.e., the threshold voltage Vt of Q6 in FIG. 15, is applied to the input, and the output potential Vs of the shift amount setting circuit 55 as a shift voltage is applied to a terminal that is usually the ground. Since the resistance of the level shift circuit is R1=R2, and the gain is set to −1, the output voltage V2 of OP2 is −Vt+2Vs.

The shift amount setting circuit 55 divides the resistance of the positive power supply potential VDL and the negative power supply potential VEL, selects the desired potential by a selector from among the numerous intermediate potentials thus extracted, and outputs the potential as Vs. The intermediate potential to be selected by the selector 168 is programmed in a tap selection circuit 166, and the selector 168 selects the desired potential in accordance with the output signal of the tap selection circuit 166. The output potential Vs of the shift amount setting circuit 55 is fed through a low-pass filter 170 to the inversion & level shift circuit 52.

The VSSR driver circuit 53 is a voltage follower circuit that uses an operational amplifier OP3, and outputs the same voltage as the output voltage of OP2 as VSSR=−Vt+2Vs. The output switch circuit 54 selectively outputs VSSR or the ground potential VSS as the voltage potential VSSA. The sense amplifier selection signal SE is inputted to a delay circuit 160 and inverted (e.g., inverters or NOT gates 162 and 164), and inputted to the gate of an nMOS transistor Q7. Consequently, the period during which SE is low is controlled so that VSSA=VSSR, and the period during which SE is high is controlled so that VSSA=VSS after a certain delay from the time that SE changes to high. The power supply of the VSSA is thereby switched from the temperature-compensated VSSR to the ground potential (VSS) after a certain delay time after a read signal voltage has occurred in the bit line, and a sense amplification operation has been initiated by the nMOS transistor Q1, as described above.

<Sense Circuit Processing>

The sense circuit of the present embodiment performs processing such as described hereinafter and compensates for the temperature of the MOS transistor that constitutes the sense circuit.

Figure 16B:
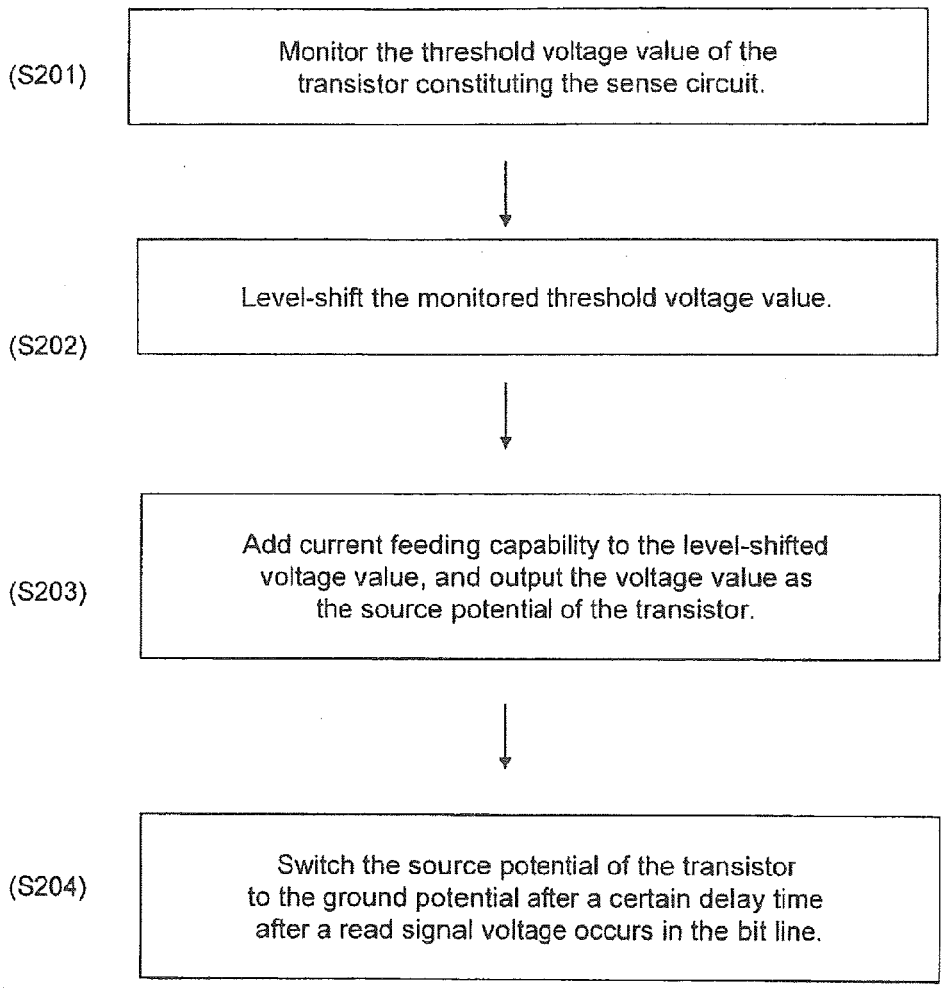
FIG. 16B is a diagram of the sense circuit processing according to example Embodiment 2.

Referring to FIG. 16B, first, the threshold voltage value of the MOS transistor constituting the sense circuit is monitored (step S201), and the monitored threshold voltage value is level-shifted so that the converted voltage value is the source potential of the nMOS transistor Q1 at the reference temperature (step S201).

Current feeding capability is added to the level-shifted voltage value, the voltage value is outputted as the source potential of the nMOS transistor Q1 (step s203), and the source potential of the nMOS transistor Q1 is switched to the ground potential after a certain delay time has elapsed after a read signal voltage has occurred in the bit line (step S204).

Consequently, through the use of a simple structure, the temperature of a MOS transistor constituting the sense circuit can be accurately compensated for, and the operating margin of the sense circuit can be adequately maintained.

<VSSR Generation Process>

Figure 17:
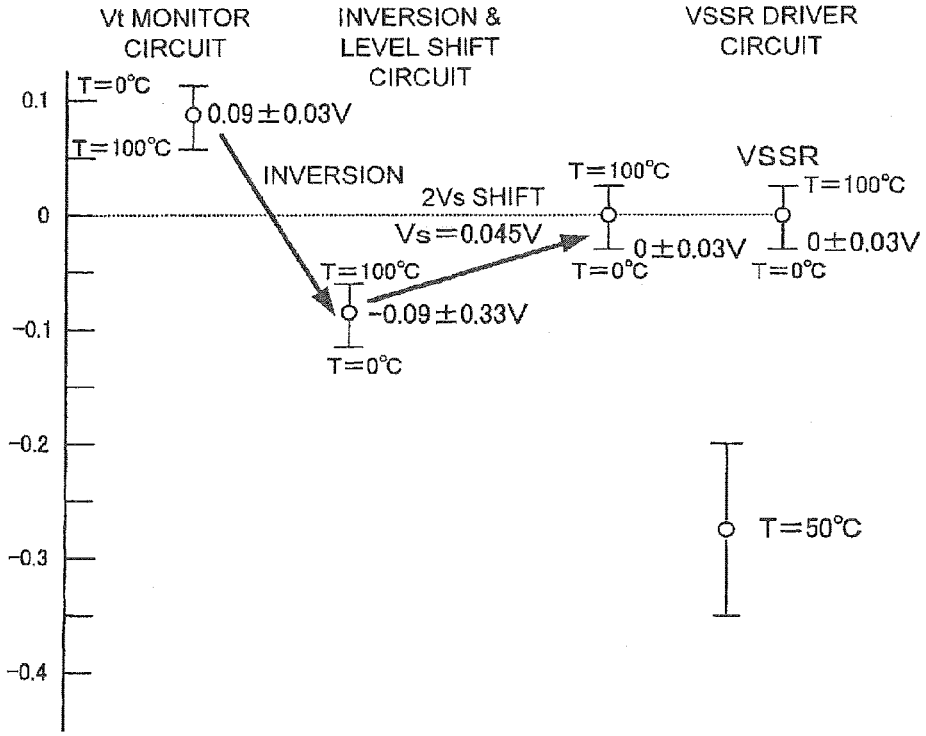
FIG. 17 is a diagram showing the VSSR generation process according to Embodiment 2.

The VSSR generation process will next be specifically described using FIG. 17.

FIG. 17 is a schematic diagram showing the output voltage transitions of each circuit in the VSSA generation circuit described above. In the Vt monitor circuit 51, the threshold voltage Vt of Q6 at the reference temperature 50° C. is 0.09 V, and the temperature dependence of the threshold voltage Vt of Q6, for which the change due to temperature dependence between 0° C. and 100° C. is ±0.03 V, is monitored and outputted.

This voltage is then inverted by the inversion & level shift circuit 52 and shifted by 2Vs. In the present embodiment, since the output voltage of the level shift circuit is set to 0 V at the reference temperature 50° C., the tap selection circuit 166 of the shift amount setting circuit 55 is programmed so that the value of Vs is 0.045 V, and as a result, the output potential of the level shift circuit becomes 0±0.1 V, the temperature dependence is inverted from the output of the Vt monitor circuit 51, and this voltage is outputted from the VSSR driver circuit 53.

<Operational Waveform of the Sense Circuit>

The operational waveform of the sense circuit when temperature compensation is performed will next be described using FIG. 18. In FIG. 18, the vertical axis indicates voltage, and the horizontal axis indicates time.

A case will be described in which high ("H") data are read from the memory cell (FIG. 18(A)). Each voltage VSSA is set to the ground potential 0 V.

In the case of high data reading, PC is first low and /PC is high in the pre-charge release period, the nMOS transistor Q2 and the pMOS transistor Q5 each turn off, and the bit line BL and the global bit line GBL are floating in a state of being pre-charged to 0V and VDD, respectively.

Then, when the cell selection period occurs, a high signal voltage is read to the bit line from the memory cell when WL has changed to high; SE then changes to high and the sense period begins. In the sense period, since the potential of the bit line is higher than the upper limit of the distribution of the threshold voltage Vt of the nMOS transistor Q1, the drain current of the nMOS transistor Q1 is large, and the charge charged by the parasitic capacitance Cgb of the global bit line GBL withdraws rapidly. The potential of the global bit line GBL therefore rapidly discharges from VDD to 0 V.

The potential of the global bit line GBL at the end of the sense period is 0 V, and this potential is detected as low by the global bit line sense circuit, and inverted by an inverter circuit (not shown) and read as high data. The distribution of the threshold voltage Vt of the nMOS transistor Q1, which is the shaded portion of the diagram (Vt Distribution of Q1), indicates the range of dimensional variation at the time of manufacturing, the variation of the gate insulation film thickness, or the variation of the threshold voltage due to such factors as fluctuation of the channel impurity distribution. When the restore period occurs, SE changes to low, the bit line potential is changed to the high level of VDD by a rewriting circuit (not shown), and high data are written back to the memory cell.

Figure 18B:
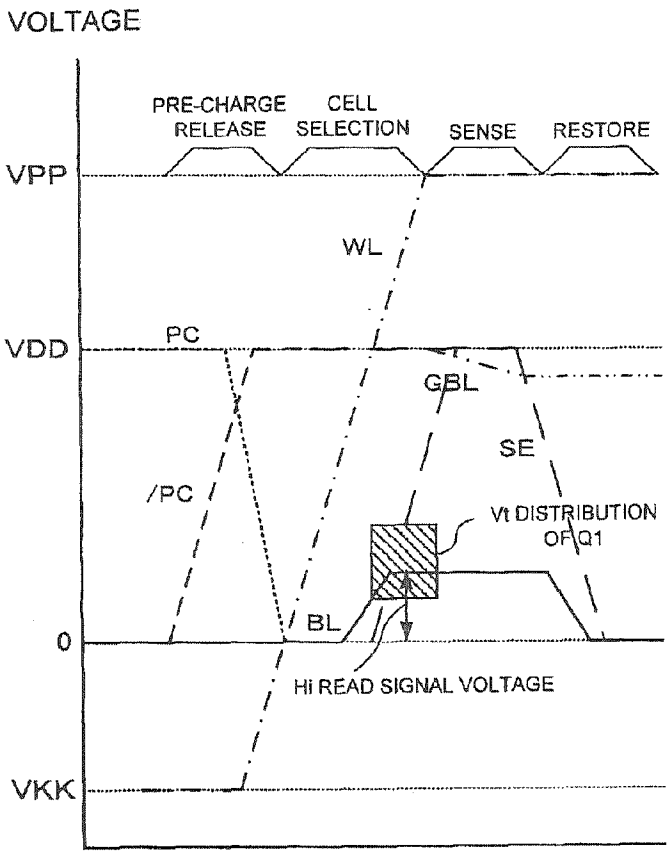
FIG. 18 is an operational waveform diagram for the temperature compensation sense circuit according to Embodiment 2.
Figure 18A:
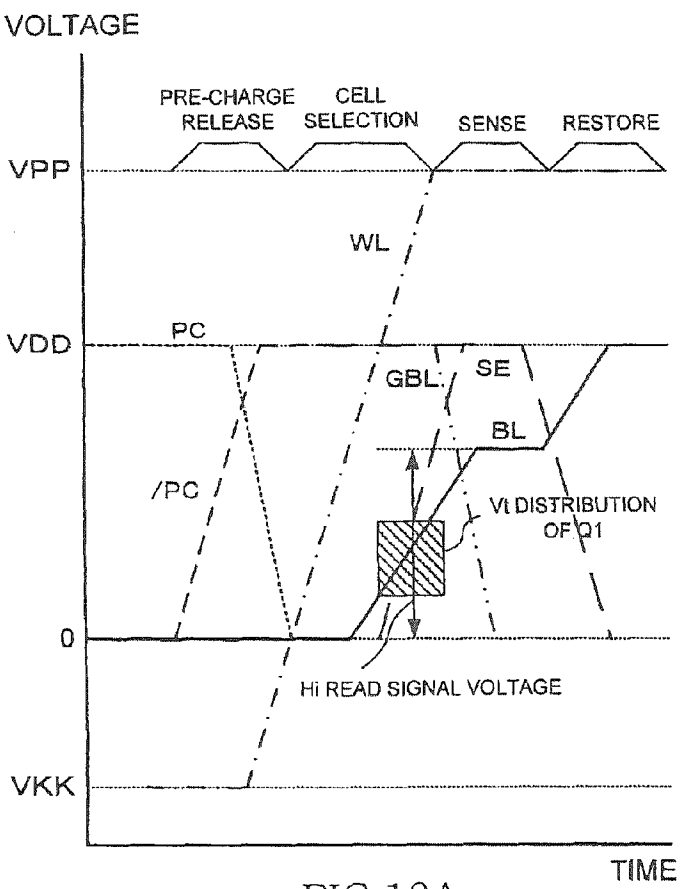

In a case in which low ("L") data are read from the memory cell (FIG. 18(B)), PC is first low and /PC is high in the pre-charge release period, the nMOS transistor Q2 and the pMOS transistor Q5 each turn off, and the bit line BL and the global bit line GBL are floating in a state of being pre-charged to 0V and VDD, respectively.

Then, when the cell selection period occurs, a low signal voltage is read to the bit line from the memory cell when WL has changed to high; SE then changes to high and the sense period begins. In the sense period, since the potential of the bit line is slightly higher than the lower limit of the distribution of the threshold voltage Vt of the nMOS transistor Q1, the drain current of the nMOS transistor Q1 is small, the charge charged by the parasitic capacitance Cgb of the global bit line GBL withdraws slowly, and the potential of the global bit line GBL slowly discharges from VDD.

Since the potential of the global bit line GBL at the end of the sense period is slightly lower than VDD, the potential is sense-amplified as high by the global bit line sense circuit, and inverted by an inverter circuit (not shown) and read as low data. When the restore period occurs, SE changes to low, the bit line potential is changed to a low level of 0 V by a rewriting circuit (not shown), and low data are written back to the memory cell.

Through the present embodiment as described above, since the source potential of the MOS transistor is controlled to a potential set in advance, and temperature dependence is compensated for, temperature compensation can be accurately performed by a simple structure. Since variations that accompany temperature dependence of the threshold voltage of the MOS transistor constituting the sense circuit are cancelled out, the operating margin of the sense circuit is enhanced, and the sense operation of the memory is stabilized. Furthermore, since the allowable range of variation in the manufacturing of MOS transistors can be enlarged, memory can be provided that is adapted for miniaturization and an increased degree of integration.

The operating margin of the sense circuit is enhanced, and the sense operation of the memory is stabilized by temperature compensation as described above in the sense circuit according to the present embodiment. The sense circuit can therefore also be used in high-precision data processing systems and the like.

Embodiments of the present disclosure were described in detail above with reference to the accompanying drawings, but the specific configuration of the present invention is not limited by the embodiments, and the present invention also encompasses designs and the like in ranges that do not depart from the intended scope of the present invention.

For example, the polarities of the MOS transistors were configured as described above in the present embodiment, but it is also possible to form a circuit in which the polarities of the MOS transistors are all reversed. In this case, the relationship of the power supply potential and the ground is reversed, and the polarity of the control signal is also reversed.

Furthermore, the present invention may also be used in other memory that includes non-volatile memory other than DRAM, and in a sensing circuit in a part that has a function other than that of memory.

Moreover, it will thus be appreciated that the embodiments described above are cited by way of example, and that the present invention is not limited to what has been particularly shown and described hereinabove. Rather, the scope of the present disclosure includes both combinations and subcombinations of the various features described hereinabove, as well as variations and modifications thereof which would occur to persons skilled in the art upon reading the foregoing description. The language of "present invention" or "invention" in this application and prosecution should not be improperly interpreted as limiting the scope of the application or claims.

What is claimed is:

1. A semiconductor device comprising:

a sense amplifier including a sensing transistor for amplifying data signal and a control transistor connected to a signal line, the sensing transistor having a gate electrode connected to the signal line for transmitting the data signal and a drain connected to an output line, and the control transistor controlling a potential of the signal line to a predetermined potential before the data signal is transmitted to the signal line;

an internal power supply circuit connected to a source of the control transistor or a source of the sensing transistor; and a temperature compensation circuit for compensating for temperature dependence of the sensing transistor by controlling an output voltage of the internal power supply circuit.

2. The semiconductor device as claimed in claim 1, wherein at least the sensing transistor and the temperature compensation circuit comprise field-effect transistors.

3. The semiconductor device as claimed in claim 1, wherein the output voltage of the internal power supply circuit is supplied to the source of the control transistor.

4. The semiconductor device as claimed in claim 1, wherein the output voltage of the internal power supply circuit is supplied to the source of the sensing transistor.

5. The semiconductor device as claimed in claim 1, further comprising a memory cell connected to the signal line; wherein a portion of a charge of the data signal is transmitted by the signal line by accessing the memory cell.

6. the semiconductor device as claimed in claim 5, wherein the memory cell includes a capacitor for storing an electric charge, and a selecting transistor for selecting the capacitor.

7. The semiconductor device as claimed in claim 6, wherein the predetermined potential is set to a potential at which the signal line transitions in one direction from the predetermined potential by accessing the memory cell, regardless of information of the memory cell.

8. The semiconductor device as claimed in claim 7, wherein the temperature compensation circuit includes:

a monitor circuit for monitoring a threshold voltage value of the sensing transistor;

a conversion circuit for converting the threshold voltage value of the sensing transistor monitored by the monitor circuit into a converted voltage value, according to a transfer ratio determined by a capacitance of the capacitor and a parasitic capacitance of the signal line;

a level shift circuit for level shifting the converted voltage value to a voltage set in advance as the output voltage of the internal power supply circuit at a predetermined temperature; and a driver circuit for supplying a level-shifted voltage value outputted from the level shift circuit as the output voltage of the internal power supply circuit by adding a current supplying capability to the level-shifted voltage value.

9. The semiconductor device as claimed in claim 8, wherein the temperature compensation circuit further includes an output switch circuit provided in a stage subsequent to the driver circuit for switching its output voltage from the level-shifted voltage to a ground potential after a read signal voltage of the signal line has been generated and after a certain delay time has elapsed.

10. The semiconductor device as claimed in claim 8, wherein the monitor circuit includes a monitor transistor that is substantially the same size as the sensing transistor and a differential amplifier; and a drain of the monitor transistor is connected to a power supply, a constant-current source is connected to the source of the monitor transistor, a source potential of the monitor transistor is supplied to the differential amplifier, a gate of the monitor transistor is connected to an output end of the differential amplifier, and a gate voltage of the monitor transistor is adjusted so that a source potential of the monitor transistor is substantially zero volts.

11. The semiconductor device as claimed in claim 5, wherein the data comprise information of the memory cell, the signal line comprise a local bit line of the memory cell, the sensing transistor comprise the sense amplifier for first amplifying the information of the memory cell, and the output line connected to the drain of the sensing transistor comprise a global bit line; and the semiconductor device has a hierarchical bit line structure formed by the local bit line and the global bit line.

12. The semiconductor device as claimed in claim 11, wherein a memory cell array is formed by a plurality of the memory cells and a plurality of the sense amplifiers that corresponds to the memory cells; and the output of the internal power supply circuit controlled by the temperature compensation circuit is connected in common to the plurality of sense amplifiers that are connected to the local bit lines.

13. The semiconductor device as claimed in claim 1, wherein the temperature compensation circuit is mounted for each semiconductor chip; and a plurality of the semiconductor chips is mounted in the semiconductor device.

14. A semiconductor device comprising:

a memory cell including a storage element for storing information and a selecting transistor for selecting the storage element;

a bit line connected to the memory cell;

a sense amplifier including a sensing transistor for reading data on the bit line and a control transistor connected to the bit line, the sensing transistor having a gate connected to the bit line and a drain connected to an output line, and the control transistor controlling a potential of the bit line to a predetermined potential before the information is read out from the memory cell to the bit line;

an internal power supply circuit connected to a source of the control transistor or a source of the sensing transistor; and a temperature compensation circuit configured from field-effect transistors for compensating for temperature dependence of the sensing transistor by controlling an output voltage of the internal power supply circuit.

15. The semiconductor device as claimed in claim 14, wherein the output voltage of the internal power supply circuit compensated by the temperature compensation circuit is supplied to the source of the control transistor so as to control the predetermined potential.

16. The semiconductor device as claimed in claim 14, wherein the output voltage of the internal power supply circuit compensated by the temperature compensation circuit is supplied to the source of the sensing transistor so as to operate the sensing transistor.

17. The semiconductor device as claimed in claim 14, wherein the storage element includes a capacitor for storing an electric charge; and the temperature compensation circuit includes:

a monitor circuit for monitoring a threshold voltage value of the sensing transistor;

a conversion circuit for converting the threshold voltage value of the sensing transistor monitored by the monitor circuit into a converted voltage value, according to a transfer ratio determined by a capacitance of the capacitor and a parasitic capacitance of the bit line;

a level shift circuit for level shifting the converted voltage value to a voltage set in advance as the output voltage of the internal power supply circuit at a predetermined temperature; and a driver circuit for supplying a level-shifted voltage value outputted from the level shift circuit as the output voltage of the internal power supply circuit by adding a current supplying capability to the level-shifted voltage value.

18. The semiconductor device as claimed in claim 17, wherein the monitor circuit includes a monitor transistor that is substantially the same size as the sensing transistor and a differential amplifier; and a drain of the monitor transistor is connected to a power supply, a constant-current source is connected to the source of the monitor transistor, a source potential of the monitor transistor is supplied to the differential amplifier, a gate of the monitor transistor is connected to an output end of the differential amplifier, and a gate voltage of the monitor transistor is adjusted so that a source potential of the monitor transistor is substantially zero volts.

19. The semiconductor device as claimed in claim 14, wherein a memory cell array is formed by a plurality of the memory cells and a plurality of the sense amplifiers that corresponds to the memory cells;

the data is information of the memory cell, the signal line is a local bit line of the memory cell, the sensing transistor is the sense amplifier for first amplifying the information of the memory cell, and the output line connected to the drain of the sensing transistor is a global bit line;

a hierarchical bit line structure is formed by the local bit line and the global bit line; and the output of the internal power supply circuit controlled by the temperature compensation circuit is connected in common to the plurality of sense amplifiers that are connected to the local bit lines.

20. A semiconductor device comprising:

a memory cell including a capacitor for storing an electric charge, and a selecting transistor for selecting the capacitor;

a bit line connected to the memory cell;

a sense amplifier including a sensing transistor that works as a single-ended sensing amplifier configured from a field-effect transistor for reading data on the bit line and a control transistor connected to the bit line, the sensing transistor having a gate connected to the bit line and a drain connected to an output line, and the control transistor controlling a potential of the bit line to a predetermined potential before the information is read out from the memory cell to the bit line;

an internal power supply circuit connected to a power supply of the sense amplifier; and a temperature compensation circuit configured from field-effect transistors for compensating for temperature dependence of the sensing transistor by controlling an output voltage of the internal power supply circuit, wherein the predetermined voltage of the bit line or the source voltage of the sensing transistor is controlled by the output voltage.

21. A semiconductor apparatus comprising:

an amplifier comprising:

a first transistor for sensing and amplifying a first signal, the first transistor including a first electrode of a principal electrically conducting channel, a second electrode of the principal electrically conducting channel, and a control electrode, the control electrode regulating a current flow between the first electrode and the second electrode of the principal electrically conducting channel, the control electrode connected to a signal line for transmitting the first signal and the first electrode connected to an output line; and a second transistor connected to the signal line, and the second transistor controlling a potential of the signal line to a predetermined potential before the first signal is transmitted to the signal line, the control transistor including a first electrode of a principal electrically conducting channel, a second electrode of the principal electrically conducting channel, and a control electrode, the control electrode regulating a current flow between the first electrode and the second electrode of the principal electrically conducting channel;

a power supply connected to and supplying power to one of the first and second electrode of at least one of the first transistor and the second transistor; and a compensation unit for compensating temperature dependence of at least the first transistor by controlling an output voltage of the power supply.

22. The semiconductor device as claimed in claim 21, further comprising a memory cell connected to the signal line, wherein a portion of a charge of the first signal is transmitted by the signal line by accessing the memory cell, and the memory cell includes a first part for storing an electric charge, and a third transistor for selecting the first part of the memory cell.

23. The semiconductor device as claimed in claim 22, wherein the compensation unit comprises:

a first module for monitoring a threshold voltage value of the first transistor;

a second module for converting the threshold voltage value of the first transistor of the amplifier monitored by the first module into a converted voltage value, according to a transfer ratio determined by a capacitance of the first part of the memory cell and a parasitic capacitance of the signal line;

a third module for level shifting the converted voltage value to a voltage set in advance as the output voltage of the power supply at a predetermined temperature; and a driver for supplying a level-shifted voltage value outputted from the third module as the output voltage of the power supply by adding a current supplying capability to the level-shifted voltage value.

24. The semiconductor device as claimed in claim 23, wherein the monitor circuit includes a fourth transistor that is substantially the same size as the first transistor of the amplifier and a differential amplifier, the fourth transistor includes a first electrode of a principal electrically conducting channel, a second electrode of the principal electrically conducting channel, and a control electrode, the control electrode regulating a current flow between the first electrode and the second electrode of the principal electrically conducting channel; and one of a first and second electrode of the monitor transistor is connected to the power supply, a constant-current source is connected to the other one of the first and second electrode of the fourth transistor, a source potential of the fourth transistor is supplied to the differential amplifier, the control electrode of the monitor transistor is connected to an output end of the differential amplifier, and a control voltage of the fourth transistor is adjusted so that a source potential of the fourth transistor is substantially zero volts.

25. A method of *using* a semiconductor, the method comprising:

sensing and amplifying an input signal by a first device connected to a signal line;

controlling a potential of the signal line to a predetermined potential before the signal is transmitted to the signal line;

supplying power to one of the first and second devices; and compensating temperature dependence of the first device by controlling an output voltage of the supplied power.

26. The method as claimed in claim 25, further comprising:

transmitting a portion of a charge of the first signal by the signal line by accessing a memory unit.

storing an electric charge in a first part of the memory unit; and selecting the first part of the memory unit;

monitoring a threshold voltage value of the first device;

converting the threshold voltage value of the first device into a converted voltage value, according to a transfer ratio determined by a capacitance of the first part of the memory unit and a parasitic capacitance of the signal line;

level shifting the converted voltage value to a voltage set in advance as the output voltage of the supplied power at a predetermined temperature; and supplying a level-shifted voltage value outputted from the level shifting as the output voltage of the supplied power by adding a current supplying capability to the level-shifted voltage value.

*27. A semiconductor device comprising:*

*a sense amplifier including a sensing transistor for amplifying a data signal and a control transistor connected to a signal line, the sensing transistor having a gate electrode connected to the signal line for transmitting the data signal and a drain connected to an output line, and the control transistor controlling a potential of the signal line to a predetermined potential before the data signal is transmitted to the signal line;*

*an internal power supply circuit connected to a source of the control transistor or a source of the sensing transistor; and*

*a compensation circuit for compensating for a characteristic of the sensing transistor by controlling an output voltage of the internal power supply circuit.*

*28. The semiconductor device as claimed in claim 27, wherein the compensation circuit is a temperature compensation circuit.*

*29. The semiconductor device as claimed in claim 27, wherein the characteristic of the sensing transistor is a threshold voltage.*

*30. The semiconductor device as claimed in claim 29, wherein the compensation circuit is a temperature compensation circuit for compensating temperature dependence of the threshold voltage.*

*31. The semiconductor device as claimed in claim 27, wherein at least the sensing transistor and the compensation circuit comprise field-effect transistors.*

*32. The semiconductor device as claimed in claim 27, wherein the output voltage of the internal power supply circuit is supplied to the source of the control transistor.*

*33. The semiconductor device as claimed in claim 27, wherein the output voltage of the internal power supply circuit is supplied to the source of the sensing transistor.*

*34. The semiconductor device as claimed in claim 27, further comprising a memory cell connected to the signal line, wherein a portion of a charge of the data signal is transmitted by the signal line by accessing the memory cell.*

*35. The semiconductor device as claimed in claim 34, wherein the memory cell includes a capacitor for storing an electric charge, and a selecting transistor for selecting the capacitor.*

*36. The semiconductor device as claimed in claim 27, further comprising a selection transistor for selectively connecting the drain of the sensing transistor to the output line.*

* * * * *